(12) United States Patent
Kondo et al.

(10) Patent No.: US 7,896,693 B2
(45) Date of Patent: Mar. 1, 2011

(54) RETAINING MEMBER ELECTRIC COMPONENT AND ELECTRIC DEVICE

(75) Inventors: Mitsuaki Kondo, Inazawa (JP); Takayoshi Honda, Nagoya (JP); Kouji Oonishi, Nagoya (JP)

(73) Assignee: Denso Corporation, Kariya (JP)

( * ) Notice: Subject to any disclaimer, the term of this patent is extended or adjusted under 35 U.S.C. 154(b) by 100 days.

(21) Appl. No.: 12/320,062

(22) Filed: Jan. 15, 2009

(65) Prior Publication Data

US 2009/0186520 A1  Jul. 23, 2009

(30) Foreign Application Priority Data

Jan. 17, 2008 (JP) .............................. 2008-008360
Jun. 25, 2008 (JP) .............................. 2008-166454

(51) Int. Cl.
*H01R 13/60* (2006.01)

(52) U.S. Cl. ...................................................... 439/567

(58) Field of Classification Search ................ 439/567, 439/569, 571

See application file for complete search history.

(56) References Cited

U.S. PATENT DOCUMENTS

| 4,639,066 | A | * | 1/1987 | Shimamiya et al. ......... 439/569 |
| 5,024,607 | A | | 6/1991 | Kachlic |
| 5,462,444 | A | | 10/1995 | Korsunsky et al. |
| 5,630,730 | A | * | 5/1997 | Wang et al. .................. 439/567 |
| 5,664,965 | A | | 9/1997 | Clark et al. |
| 5,899,771 | A | | 5/1999 | Clark et al. |
| 5,971,802 | A | | 10/1999 | Pan et al. |
| 6,081,998 | A | | 7/2000 | Terauchi et al. |
| 6,655,990 | B2 | | 12/2003 | Terauchi et al. |
| 6,923,678 | B2 | * | 8/2005 | Kato et al. .................... 439/567 |
| 7,320,619 | B2 | | 1/2008 | Takahashi et al. |
| 7,563,112 | B2 | | 7/2009 | Honda |
| 7,607,941 | B2 | * | 10/2009 | Takahashi et al. ........... 439/567 |
| 7,677,905 | B2 | | 3/2010 | Honda |
| 2007/0178725 | A1 | | 8/2007 | Tsuruzawa et al. |
| 2008/0144260 | A1 | | 6/2008 | Honda |
| 2008/0146051 | A1 | | 6/2008 | Honda |

FOREIGN PATENT DOCUMENTS

| JP | 61-202886 U | 12/1986 |
| JP | A-5-159819 | 6/1993 |
| JP | 05-79871 U | 10/1993 |
| JP | U-6-62486 | 9/1994 |

(Continued)

*Primary Examiner*—Tho D Ta
*Assistant Examiner*—Travis Chambers
(74) *Attorney, Agent, or Firm*—Posz Law Group, PLC

(57) ABSTRACT

A retaining member includes at least a leg portion having a latch portion, a coupling portion and a spring portion. When the spring portion is displaced, the coupling portion is twisted. Then, the latch portion and the coupling portion are inserted into the opening so that an electric component is retained on a main face of the substrate. In this state, a part of the latch portion is disposed at the periphery of the opening on a rear face of the substrate, a part of the coupling portion is disposed in the opening, and the spring portion is disposed on the main face of the substrate. Therefore, the retaining strength of the electric component to the substrate can be improved, and damage of a side wall of the opening can be decreased.

45 Claims, 19 Drawing Sheets

| | FOREIGN PATENT DOCUMENTS | | | | |
|---|---|---|---|---|---|
| JP | 08-162187 A | 6/1996 | JP | A-2007-128772 | 5/2007 |
| JP | 08-315881 A | 11/1996 | JP | A-2007-242346 | 9/2007 |
| JP | 2000-294325 A | 10/2000 | JP | A-2007-258007 | 10/2007 |
| JP | 2002-8751 A | 1/2002 | JP | 2008-147163 A | 6/2008 |
| JP | 2002-93500 A | 3/2002 | JP | A-2008-130391 | 6/2008 |
| JP | 2003-7371 A | 1/2003 | JP | A-2008-146880 | 6/2008 |
| JP | A-2004-296220 | 10/2004 | JP | 2009-252696 A | 10/2009 |

* cited by examiner

US 7,896,693 B2

RETAINING MEMBER ELECTRIC COMPONENT AND ELECTRIC DEVICE

CROSS REFERENCE TO RELATED APPLICATIONS

The present application is based on Japanese Patent Applications No. 2008-8360 filed on Jan. 17, 2008, and No. 2008-166454 filed on Jun. 25, 2008, the disclosures of which are incorporated herein by reference.

FIELD OF THE INVENTION

The present invention relates to a retaining member, an electric component and an electric device.

BACKGROUND OF THE INVENTION

A conventional retaining member included in an electric component is partially deformed by elastic force and inserted into an opening in a substrate, and the electric component is retained on the substrate by reactive force or restoring force generated by the deformation of the retaining member. For example, JP-A-2007-128772 discloses that a metal plate is punched out in a die cutting process, and then, pressure is applied to the metal plate and the metal plate is bent so that the retaining member is formed. A pair of first leg portions extends in the same direction from a flat plate-like base portion. A spring portion of the first leg portion is deformed elastically and inserted into an opening of the substrate in the plate thickness direction with a coupling portion between the spring portion and a parallel portion as a fulcrum point. The plate thickness direction is a direction substantially perpendicular to the substrate thickness and an inward direction in the opening. Then, the spring portion contacts a side wall of the opening by reactive force to the deformation, and thereby, pulling out of the electric component from the substrate is suppressed. By using the above-mentioned retaining structure, an occupied space of the electric component on the substrate can be reduced, and the number of assembling steps can be decreased compared to combining by screws.

In the retaining member of JP-A-2007-128772, the spring portion contacts the side wall of the opening by reactive force itself with respect to the elastic deformation, and the electric component is retained on the substrate. Thus, bearing force with respect to external force or tensile for pulling the spring portion from the opening is low. That is, retaining strength of the electric component to the substrate is low and the electric component is pulled out from the substrate easily.

In general, a metal coating layer is formed over the side wall of the opening. However, when bearing force with respect to tensile is improved, since reaction force having spring property with respect to the elastic deformation of the spring portion may increase, the metal coating layer is easily peeled off. That is, the side wall of the opening is easily damaged.

SUMMARY OF THE INVENTION

In view of the above-described difficulty, it is an object of the present disclosure to provide a retaining member, an electric component and an electric device.

According to a first aspect of the present disclosure, a retaining member for retaining an electric component on a main face of a substrate, the retaining member includes a base portion configured to be fixed to the electric component; and a leg portion extending from the base portion. The leg portion includes a latch portion, a coupling portion and a spring portion. The base portion and the leg portion are made of one metal plate and integrated to each other. The latch portion is coupled with one end of the coupling portion and the other end of the coupling portion is coupled with one end of the spring portion. The latch portion and the coupling portion are configured to be inserted into an opening of the substrate so that the electric component is retained on the main face of the substrate. A part of the latch portion is disposed at a periphery of the opening on a rear face of the substrate, a part of the coupling portion is disposed in the opening, and the spring portion is disposed on the main face of the substrate when the electric component is retained on the main face of the substrate. The spring portion is deformable so that the coupling portion is twisted with respect to the opening of the substrate and the latch portion is inserted into the opening.

In the above configuration, the retaining strength of the electric component to the substrate can be improved, and damage of a side wall of the opening can be decreased.

According to a second aspect of the present disclosure, an electric component includes a main body; a substrate; and a first retaining member for retaining the main body on a main face of the substrate having an opening. The first retaining member includes: a base portion configured to be fixed to the main body; and a leg portion extending from the base portion. The leg portion includes a latch portion, a coupling portion and a spring portion. The base portion and the leg portion are made of one metal plate and integrated to each other. The latch portion is coupled with one end of the coupling portion and the other end of the coupling portion is coupled with one end of the spring portion. The latch portion and the coupling portion are configured to be inserted into the opening of the substrate so that the main body is retained on the main face of the substrate. A part of the latch portion is disposed at a periphery of the opening on a rear face of the substrate, a part of the coupling portion is disposed in the opening, and the spring portion is disposed on the main face of the substrate when the main body is retained on the main face of the substrate. The spring portion is deformable so that the coupling portion is twisted with respect to the opening of the substrate and the latch portion is inserted into the opening.

In the above configuration, the retaining strength of the electric component to the substrate can be improved, and damage of a side wall of the opening can be decreased.

According to a third aspect of the present disclosure, an electric device includes a substrate having an opening; an electric component having a main body; and a retaining member for retaining the main body on a main face of the substrate. The retaining member includes: a base portion configured to be fixed to the main body; and a leg portion extending from the base portion. The leg portion includes a latch portion, a coupling portion and a spring portion. The base portion and the leg portion are made of one metal plate and integrated to each other. The latch portion is coupled with one end of the coupling portion and the other end of the coupling portion is coupled with one end of the spring portion. The latch portion and the coupling portion are configured to be inserted into the opening of the substrate so that the main body is retained on the main face of the substrate. A part of the latch portion is disposed at a periphery of the opening on a rear face of the substrate, a part of the coupling portion is disposed in the opening, and the spring portion is disposed on the main face of the substrate when the main body is retained on the main face of the substrate. The spring portion is deformable so that the coupling portion is twisted with respect to the opening of the substrate and the latch portion is inserted into the opening.

In the above configuration, the retaining strength of the electric component to the substrate can be improved, and damage of a side wall of the opening can be decreased.

According to a fourth aspect of the present disclosure, a retaining member for retaining an electric component on a main face of a substrate, the retaining member includes a base portion configured to be fixed to the electric component; and a first leg portion extending from the base portion in a first direction. The first leg portion includes a latch portion, a coupling portion and a spring portion. The base portion and the first leg portion are made of one metal plate and integrated to each other. The latch portion is coupled with one end of the coupling portion, the other end of the coupling portion is coupled with one end of the spring portion, and the other end of the spring portion is coupled with the base portion. The latch portion and the coupling portion are configured to be inserted into a first opening of the substrate so that the electric component is retained on the main face of the substrate. A part of the latch portion is disposed at a periphery of the first opening on a rear face of the substrate, a part of the coupling portion is disposed in the first opening and the spring portion is disposed on the main face of the substrate when the electric component is retained on the main face of the substrate. The spring portion is deformable so that the coupling portion is twisted with respect to the first opening of the substrate and the latch portion is inserted into the first opening. The spring portion and the coupling portion extend in the first direction. A width of the spring portion in a second direction, which is substantially perpendicular to the base portion having a plate shape, is larger than the thickness of the metal plate. A portion between a coupling end of the spring portion with the coupling portion and a coupling end of the spring portion with the base portion is a flat plate. The latch portion protrudes from the coupling portion in a third direction, which is perpendicular to the first and second direction, and a thickness direction of the flat plate of the spring portion is substantially parallel to the third direction of the latch portion.

In the above configuration, the retaining strength of the electric component to the substrate can be improved, and damage of a side wall of the opening can be decreased.

According to a fifth aspect of the present disclosure, an electric component includes a plurality of conductive terminals electrically coupled with lands on a substrate; a main body in which the plurality of terminals are disposed; and a retaining member for retaining the main body on a main face of the substrate having an opening. The retaining member includes: a base portion configured to be fixed to the electric component; and a first leg portion extending from the base portion in a first direction. The first leg portion includes a latch portion, a coupling portion and a spring portion. The base portion and the first leg portion are made of one metal plate and integrated to each other. The latch portion is coupled with one end of the coupling portion, the other end of the coupling portion is coupled with one end of the spring portion, and the other end of the spring portion is coupled with the base portion. The latch portion and the coupling portion are configured to be inserted into the opening of the substrate so that the electric component is retained on the main face of the substrate. A part of the latch portion is disposed at a periphery of the opening on a rear face of the substrate, a part of the coupling portion is disposed in the opening and the spring portion is disposed on the main face of the substrate when the electric component is retained on the main face of the substrate. The spring portion is deformable so that the coupling portion is twisted with respect to the opening of the substrate and the latch portion is inserted into the opening. The spring portion and the coupling portion extend in the first direction. A width of the spring portion in a second direction, which is substantially perpendicular to the base portion having a plate shape, is larger than the thickness of the metal plate. A portion between a coupling end of the spring portion with the coupling portion and a coupling end of the spring portion with the base portion is a flat plate. The latch portion protrudes from the coupling portion in a third direction, which is perpendicular to the first and second direction, and a thickness direction of the flat plate of the spring portion is substantially parallel to the third direction of the latch portion.

In the above configuration, the retaining strength of the electric component to the substrate can be improved, and damage of a side wall of the opening can be decreased.

According to a sixth aspect of the present disclosure, an electric device includes a substrate having a plurality of lands and a first opening; and an electric component having a plurality of conductive terminals electrically coupled with the plurality of lands, a main body in which the plurality of terminals are disposed, and a retaining member for retaining the main body on a main face of the substrate, the electric component being mounted on the substrate. The retaining member includes: a base portion configured to be fixed to the electric component; and a first leg portion extending from the base portion in a first direction. The first leg portion includes a latch portion, a coupling portion and a spring portion. The base portion and the first leg portion are made of one metal plate and integrated to each other. The latch portion is coupled with one end of the coupling portion, the other end of the coupling portion is coupled with one end of the spring portion and the other end of the spring portion is coupled with the base portion. The latch portion and the coupling portion are configured to be inserted into the first opening of the substrate so that the electric component is retained on the main face of the substrate. A part of the latch portion is disposed at a periphery of the first opening on a rear face of the substrate, a part of the coupling portion is disposed in the first opening and the spring portion is disposed on the main face of the substrate when the electric component is retained on the main face of the substrate. The spring portion is deformable so that the coupling portion is twisted with respect to the first opening of the substrate and the latch portion is inserted into the first opening. The spring portion and the coupling portion extend in the first direction. A width of the spring portion in a second direction, which is substantially perpendicular to the base portion having a plate shape, is larger than the thickness of the metal plate. A portion between a coupling end of the spring portion with the coupling portion and a coupling end of the spring portion with the base portion is a flat plate. The latch portion protrudes from the coupling portion in a third direction, which is perpendicular to the first and second direction, and a thickness direction of the flat plate of the spring portion is substantially parallel to the third direction of the latch portion.

In the above configuration, the retaining strength of the electric component to the substrate can be improved, and damage of a side wall of the opening can be decreased.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
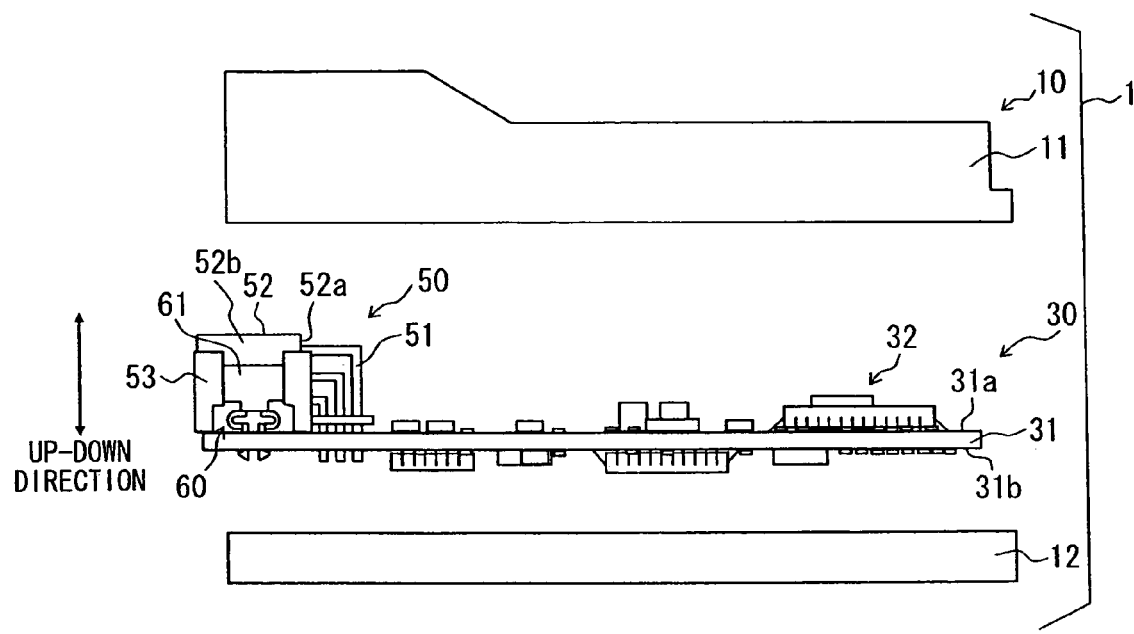
FIG. 1 is an exploded view showing a structure of an electric control device according to a first embodiment.
Figure 2:
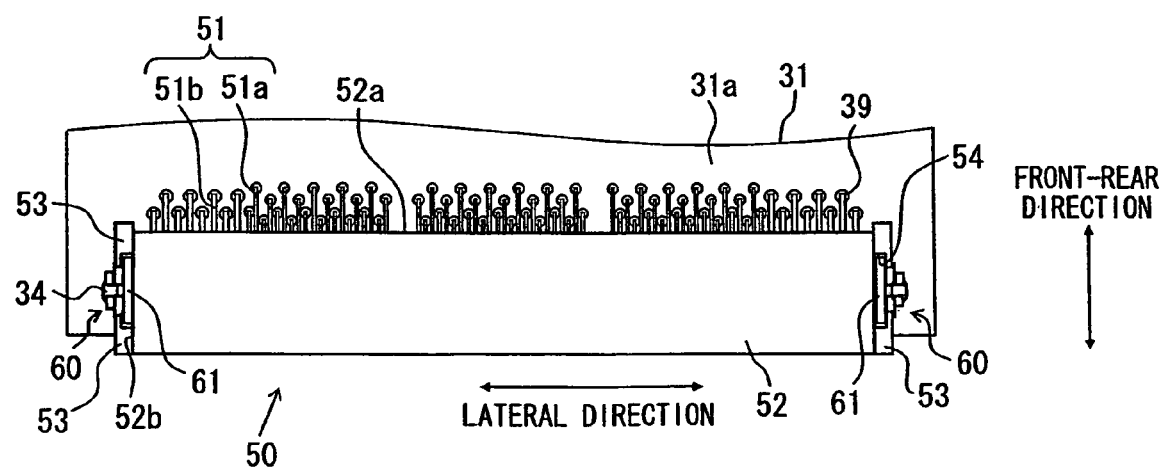
FIG. 2 is a plan view of a mounting portion, in which a connector is mounted on a substrate.

Hereinafter, a first embodiment of the present invention will be described with reference to FIG. 1 to FIG. 7. As shown in FIG. 1, a thickness direction of a substrate indicates an up-down direction. As shown in FIG. 2, a terminals arranging direction in a housing 52 or a longitudinal direction of the housing 52 indicates a lateral direction, and a direction perpendicular to the up-down direction and the lateral direction indicates a front-rear direction or a latitudinal direction of the housing.

In following embodiments, the retaining member has significant features, and a connector including the retaining member and an electric device including the retaining member will be described. The electric device is an electric control device having a non-waterproof structure, and is used as an engine ECU, i.e., Electric Control Unit, of vehicles, for example.

An electric control device 1 shown in FIG. 1 includes a circuit board 30, in which an electric component 32 is mounted on a substrate 31, a connector 50 including terminals 51, a housing 52 and retaining members 60 as a substantial part. Other than the above-described elements, the electric control device 1 includes a chassis 10 for holding the circuit board 30 and the connector 50.

The chassis 10 is made of metal material such as aluminum and iron or resin material, and the circuit board 30 and a part of the connector 50 are held inside the chassis 10. The chassis 10 may be configured from one element or multiple elements. In the present embodiment, as shown in FIG. 1, the chassis 10 is configured by two elements, that is, a box-shaped case 11 with one side opened, and a cover 12 for closing the one side of the case 11. The cover 12 is substantially rectangular plate-like shape and has a shallow bottom. By combining the case 11 with the cover 12, the chassis 10 including internal space for holding the circuit board 30 and the connector 50 is provided. A window portion, which is not shown in the drawings, for the connector 50 is provided in the chassis 10 or the case 11. The case 11 and the cover 12 are combined by screws, for example, to hold the circuit board 30. Then the circuit board 30 and a part of the connector 50 including a connecting side to the circuit board 30 in the terminal 51 are held inside the chassis 10. The rest of the connector 50 including a connecting side to an external connector in the terminal 51 is exposed outside the chassis 10.

Figure 6A:
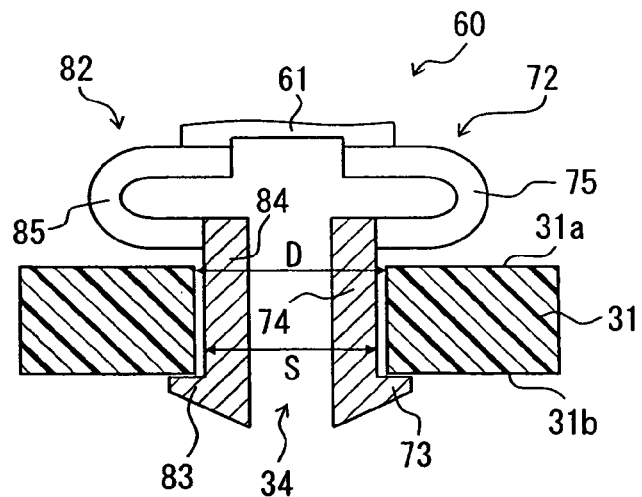
FIG. 6A is a partially cross sectional view showing a structure that the connector is retained on a main face of the substrate.
Figure 6B:
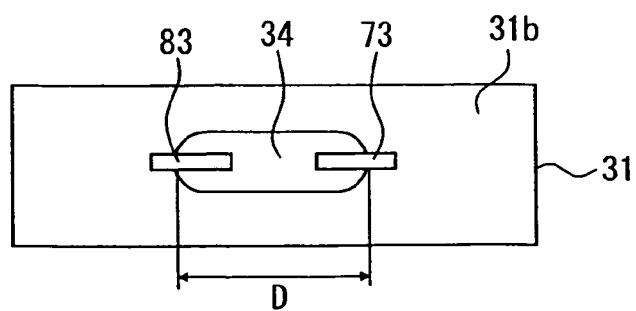
FIG. 6B is a plan view seen from a rear face of the substrate showing a structure that the connector is retained on a main face of the substrate.

As shown in FIG. 1, the electric components 32 such as a microcomputer, a power transistor, a resistor and a capacitor are mounted on the substrate 31, in which wirings including lands as electrodes and via holes for connecting between the wirings are disposed, so that the circuit board 30 is provided. In the present embodiment, the connector 50 for electrically connecting the circuit board 30 to the external connector is mounted on the substrate 31 as one of the electric components 32. As shown in FIG. 2, an opening 34 and a hole 39 are provided in the substrate 31. A first leg portion 62 of the retaining member 60 is inserted into the opening 34 and a mounting portion of the terminal 51 is inserted into the hole 39. Specifically, as shown in FIG. 2, two openings 34 are disposed at the outside of both ends of the housing 52, and multiple holes 39 are disposed between the two openings 34 in the lateral direction. A metal coating layer, which is not shown in the drawings, is formed on a side wall of the openings 34 and the holes 39 and on the substrate 31 at the periphery of the openings 34 and the holes 39. The metal coating layer formed on the side wall of the holes 39 is used as lands of wirings formed on the substrate 31. The cross-sectional shapes of the opening 34 and the hole 39 may be taken an arbitrary form. In the present embodiment, as shown in FIG. 6B, the opening 34 has a substantially elliptical cross-sectional shape, in which the length of the opening 34 in the front-rear direction is larger than that in the lateral direction. The hole 39 has a substantially circular shape.

Multiple terminals 51 made of a conductive material are arranged on a main face 31a of the substrate 31 along with the housing 52 made of an electrical insulating material, resin is used in the present embodiment, so that the connector 50 is provided. An end portion of one side of the terminal 51, which is extended from a front face 52a of the housing 52, is inserted into the corresponding hole 39, and is electrically connected to the metal coating layer through solder, which is not shown in the drawings. Another end portion of the terminal 51, which is extended from a rear face of the housing 52, is exposed to the outside of the chassis 10, and is electrically connected to an external connector. As shown in FIG. 2, the terminal 51 includes a signal terminal 51a for transmitting a signal and a power terminal 51b for transmitting electric power, which is thicker than the signal terminal 51a. A part of each of the terminals 51, which forms a planar shape along the main face 31a, is retained so as not to interfere each other and arranged along the lateral direction of the housing 52, which has a substantially rectangular shape with elongated in the lateral direction.

Island portions 53 are disposed on both end portions 52b of the housing 52 in the lateral direction. The island portions 53 are extended outwardly from portions corresponding to four corners of the housing 52. As shown in FIG. 2, a groove portion 54 having a vertical slit shape is formed from a top surface of one of the island portions 53 to an opposing surface of another island portion 53 in the front-rear direction. The retaining member 60 is inserted from an upper portion into each of the groove portions 54, which are located on both sides of the housing 52 in the lateral direction.

Figure 3:
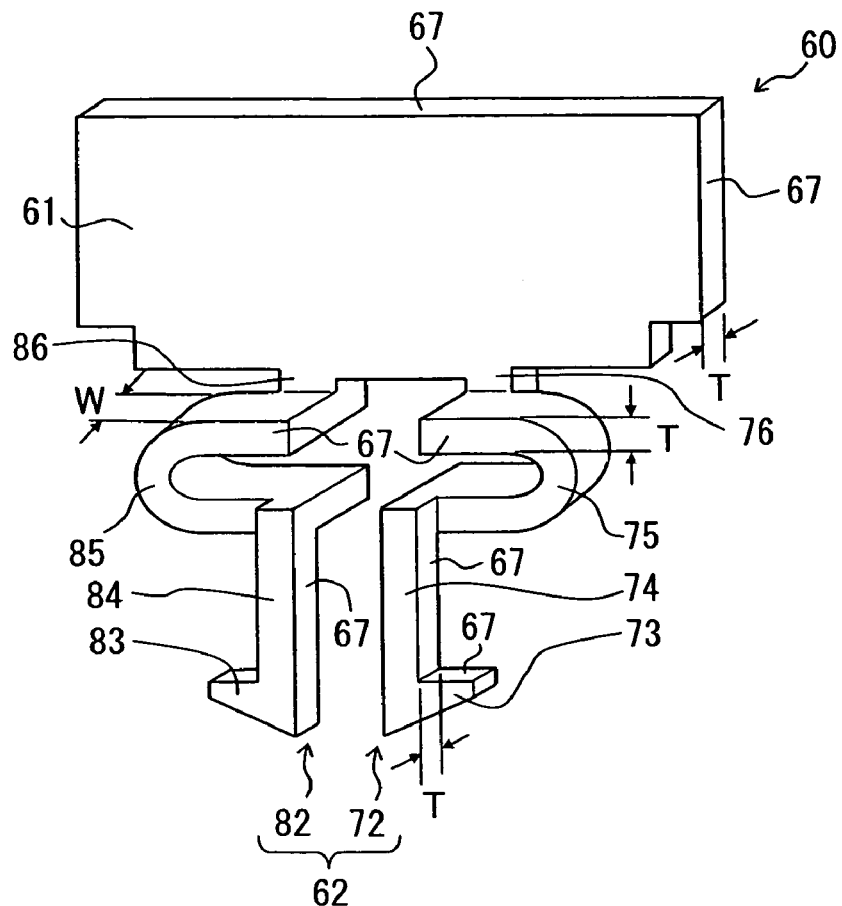
FIG. 3 is a perspective view showing a structure of a retaining member.

The retaining member 60 is inserted into the opening 34, and makes the connector 50 difficult to pull out from the substrate 31 at least before the soldering. That is, the retaining member 60 retains the connector 50 on the main face 31a of the substrate 31. As shown in FIG. 3, the retaining member 60 includes a base portion 61 and the first leg portion 62, i.e., a pair of first leg portions 72 and 82, which are integrally formed.

The base portion 61 is a fixing portion of the retaining member 60 to the housing 52. The base portion 61 has a substantially rectangular flat plate shape. The base portion 61 is inserted into and fixed to the groove portion 54 formed on the end portion 52b of the housing 52. The first leg portion 62 is extended downwardly, that is, toward the substrate 31, from a lower end portion at a substantial center portion of the base portion 61.

The first leg portion 62 is a portion for retaining the connector 50 on the main face 31a of the substrate 31 at least before the soldering. A part of the first leg portion 62 is inserted into the opening 34 of the substrate 31. As the first leg portion 62, the pair of first leg portions 72 and 82 is extended in a same direction, that is, downwardly from the lower end portion at the substantial center portion of the base portion 61.

In the pair of first leg portions 72 and 82, one first leg portion 72 includes a latch portion 73 disposed on an end portion of the first leg portion 72, i.e., a lower end of the first leg portion 72. With the connector 50 retained on the substrate 31, hereinafter referred to as a retaining state, a part of the latch portion 73 is disposed at the periphery of the opening 34 in the rear face 31b of the substrate 31. The latch portion 73 is connected to an end portion of a coupling portion 74, a part of which is disposed in the opening 34 in the retaining state. Another end portion of the coupling portion 74 is connected to a spring portion 75 disposed on the main face 31a of the substrate 31 in the retaining state. The spring portion 75 is deformed when the latch portion 73 and the coupling portion 74 are inserted into the opening 34. Thereby, the coupling portion 74 is twisted with respect to the retaining state of the coupling portion 74, and the latch portion 73 is inserted into the opening 34. An end portion of the spring portion 75 opposite to a connecting portion between the coupling portion 74 and the spring portion 75 is connected to the base portion 61 through a bonding portion 76. The reference numeral 67 shown in FIG. 3 denotes an end face of a flat metal plate for forming the retaining member 60.

As shown in FIG. 3, the linear bonding portion 76 is extended downwardly from the base portion 61 in the same plane with the substantially rectangular plate-like base portion 61. In case that the spring portion 75 does not contact the base portion 61 by the displacement of the spring portion 75, the bonding portion 76 may not be provided. The bending process is performed to the metal plate with the metal plate bent substantially 90 degrees at the bonding portion 76, that is, with the metal plate bent toward the outside of the housing 52 in the lateral direction, as shown in FIG. 2. The substantially U-shaped spring portion 75 is extended from the bonding portion 76. The spring portion 75 is supported by the base portion 61 through the bonding portion 76. The spring portion 75 includes a base part, a folding part and a flection part. The base part connecting to the bonding portion 76 is connected to the folding part opposing to the base part through the flection part. The base part and the folding part are substantially parallel when the spring portion 75 is not displaced. Moreover, the base part and the folding part are substantially parallel to the main face 31a of the substrate 31. As shown in FIG. 3, a width W of the spring portion 75, i.e., a width in a direction substantially perpendicular to the extending direction of the spring portion 75 and the plate thickness direction, is larger than a plate thickness T, i.e., a thickness of the flat metal plate. The metal plate is bent substantially 90 degrees at the folding portion of the spring portion 75, that is, the metal plate is bent toward the outside of the housing 52 in the lateral direction, as shown in FIG. 2 so that the coupling portion 74 is formed. The coupling portion 74 is substantially perpendicular to the main face 31a of the substrate 31 when the spring portion 75 is not displaced. The end face 67 of the coupling portion 74 opposes to the side wall of the opening 34. The coupling portion 74 is rigid so as to be hardly deformed when the latch portion 73 and the coupling portion 74 are inserted into the opening 34. The length of the coupling portion 74 in the up-down direction is adjusted so that the spring portion 75 does not contact the main face 31a of the substrate 31 until the latch portions 73 is disposed on the rear face 31b of the substrate 31. The latch portion 73 is extended from the coupling portion 74 in the front-rear direction with the latch portion 73 being in a same plane with a lower end of the coupling portion 74. A surface of the latch portion 73, the surface which opposes to the rear face 31b of the substrate 31, is substantially parallel to the rear face 31b of the substrate 31. The nearer an edge portion of the latch portion 73 apart from the coupling end of the coupling portion 74 in the front-rear direction, the narrower a width of the latch portion 73 in the up-down direction. That is, the latch portion 73 has a wedge shape. At least a part of the end face 67 of the latch portion 73 is disposed on or opposed to the rear face 31b of the substrate 31 in the retaining state.

On the other hand, another first leg portion 82 extends in the same direction with the first leg portion 72 from a lower end portion at a substantially center portion of the base portion 61. The first leg portion 82 is symmetrical to the first leg portion 72. The first leg portion 82 includes a latch portion 83, a coupling portion 84, a spring portion 85 and a bonding portion 86 same as the first leg portion 72.

Figure 5:
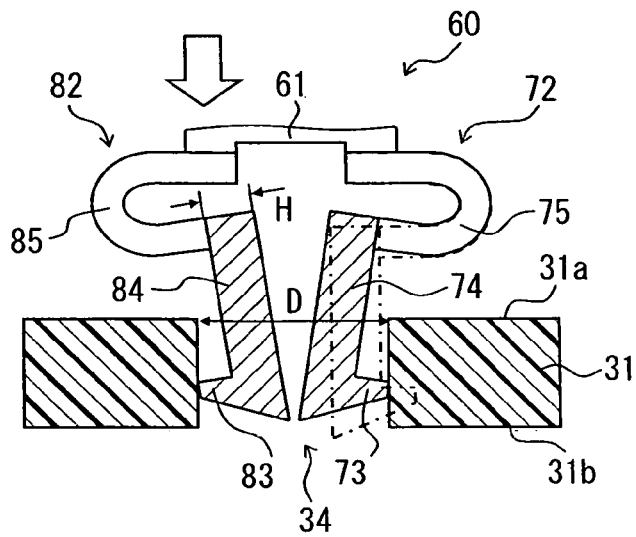
FIG. 5 is a partially cross sectional view showing the retaining member when the first leg portion is inserted into the opening.

The direction of the latch portion 73 extending from the coupling portion 74 in the first leg portion 72 is opposite to the direction of the latch portion 83 extending from the coupling portion 84 in the first leg portion 82. As shown in FIG. 6B, the latch portion 73 is disposed on the rear face 31b of the substrate 31 at one side in the longitudinal direction, i.e., in the front-rear direction, of the opening 34. The latch portion 83 is disposed on the rear face 31b of the substrate 31 at another side, with respect to a cross section of the substantially ellipsoidal-shaped opening 34, which is elongated in the front-rear direction. As shown in FIG. 5, a width H of each of the coupling portions 74 and 84 is smaller than a half of the length of a width D. The width D is an inner diameter of the opening 34, in which the latch portions 73 and 83 are latched in the front-rear direction. Lengths of the first leg portions 72 and 82 are adjusted such that the first leg portions 72 and 82 do not contact each other when the first leg portions 72 and 82 are inserted into the opening 34. As shown in FIG. 6A, when the spring portions 75 and 85 are not displaced, a width S between an outer surface of the coupling portion 74 and an outer surface of the coupling portion 84 is smaller than the width D of the opening 34. That is, when a part of each of the latch portions 73 and 83 is disposed on the rear face 31b of the substrate 31, the coupling portions 74 and 84 do not contact the side wall of the opening 34 so that there are clearance between the outer surface of the coupling portion 74 and the opposing side wall and clearance between the outer surface of the coupling portion 84 and the opposing side wall.

Figure 4:
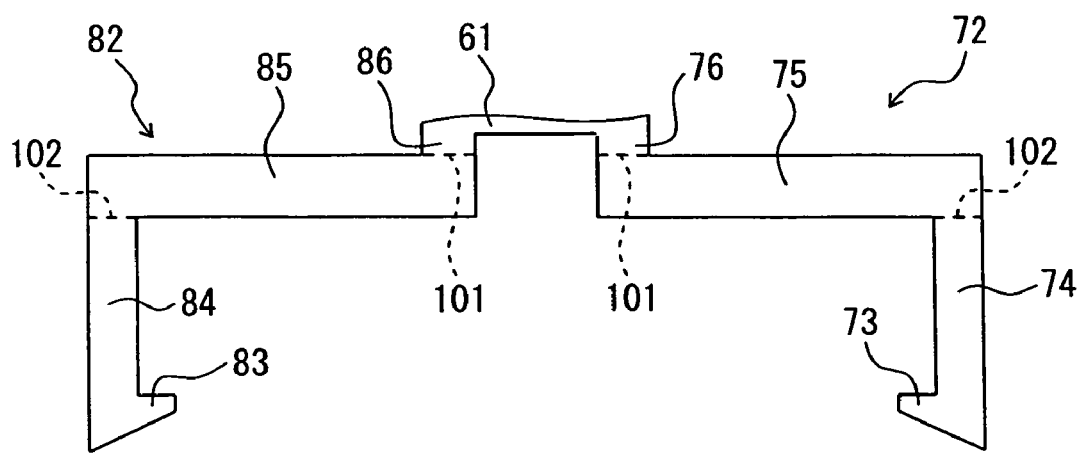
FIG. 4 is an extended view of a first leg portion of the retaining member shown in FIG. 3.

A flat metal plate is punched out in the die cutting process and bent partially so that the retaining member 60 is formed. The flat metal plate is punched out to have a shape as shown in FIG. 4. In the step, the bonding portions 76 and 86, the spring portions 75 and 85, the coupling portions 74 and 84, and the latch portions 73 and 83 are disposed in the same plane with the base portion 61. Boundaries 101 between the bonding portion 76 and the spring portion 75 and between the bonding portion 86 and the spring portion 85 are curved substantially 90 degrees with respect to the retaining member 60. Then, the spring portions 75 and 85 are bent to be substantially U-shaped. Boundaries 102 between the spring portion 75 and the coupling portion 74 and between the spring portion 85 and the coupling portion 84 are curved substantially 90 degrees. Thereby, the retaining member 60 shown in FIG. 3 is made from one metal plate. Therefore, the latch portions 73 and 83 are formed by only the die cutting process without the bending process.

Next, a method for retaining the connector 50 on the substrate 31 by the retaining member 60 will be described. Firstly, the base portion 61 of the retaining member 60 is inserted into and fixed to the groove portion 54 of the connector 50. Then, as shown in FIG. 5, the latch portions 73 and 83 of the retaining member 60 are inserted into the opening 34 toward the rear face 31b from the main face 31a in a direction shown by an outline arrow in FIG. 5. A distance between an end of the edge portion of the latch portion 73 and an end of the edge portion of the latch portion 83 before inserting is longer than the width D of the opening 34. Each of the latch portions 73 and 83 has the wedge shape, and spring portions 75 and 85 can be deformed elastically in the plate thickness direction. Therefore, when the retaining member 60 is inserted into the opening 34 in the direction of the outline arrow in FIG. 5 and the latch portions 73 and 83 contact the substrate 31, the spring portions 75 and 85 are displaced, i.e., elastically deformed with the supporting portions by the base member 61 as a fulcrum point. Thereby, the wedge-shaped latch portions 73 and 83 proceed to the inside of the opening 34 along slopes of the latch portions 73 and 83. As shown in FIG. 5, in the substantially U-shaped spring portions 75 and 85, at least the connection portions of the folding portions with each of the coupling portions 74 and 84 are displaced upwardly. The wedge-shaped latch portions 73 and 83 are inserted into the opening 34 by the displacement of the spring portions 75 and 85. The coupling portions 74 and 84 are hardly deformed elastically. The coupling portions 74 and 84 are twisted with respect to the coupling portions 74 and 84 in the retaining state or the state before inserting. That is, the spring portions 75 and 85 are displaced such that the coupling portions 74 and 84 are twisted, and the latch portions 73 and 83 are inserted into the opening 34. A dashed-dotted line shown in FIG. 5 represents the first leg portion 72 when the spring portion 75 is not displaced.

Edge portions of the latch portions 73 and 83 contact the side wall of the opening 34 by reactive force or restoring force generated by the elastic deformation of the spring portions 75 and 85. The retaining portion 60 is further pushed into the opening 34 so that the latch portions 73 and 83 are passed through the opening 34. As shown in FIG. 6A and FIG. 6B, at least a part of the latch portions 73 and 83 is disposed at the periphery of the opening 34 on the rear face 31b of the substrate 31 by reactive force of the spring portions 75 and 85. Thereby, the retaining member 60, i.e., the connector 50, is retained on the substrate 31.

Figure 7:
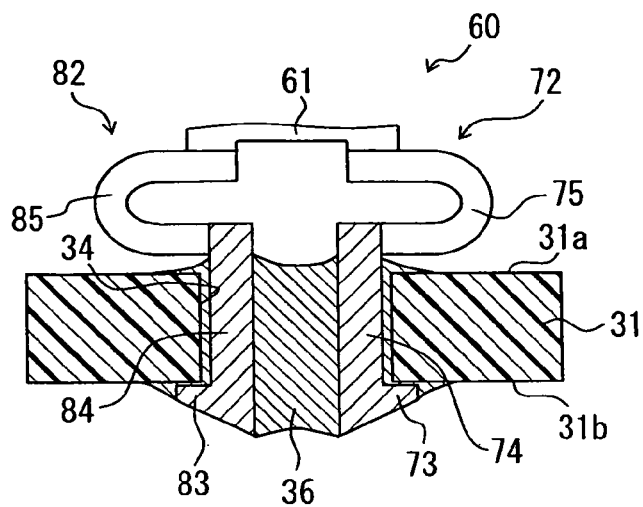
FIG. 7 is a partially cross sectional view showing the first leg portion after the flow soldering.

In the present embodiment, a terminal having the through-hole mounting structure is used as the terminal 51. The terminal 51 is connected to the land formed on the side wall and the periphery of the hole 39 by the flow soldering with the terminal 51 inserted into the corresponding hole 39. The retaining member 60 is also connected to the land by the flow soldering. In the flow soldering process, after the retaining member 60 is inserted into the opening 34 and the latch portions 73 and 83 are disposed on the rear face 31b of the substrate 31, the rear face 31b is totally or locally soaked in the molten solder. The metal coating layer formed on the side wall and the periphery of the opening 34 and the first leg portions 72 and 82 of the retaining member 60 are wetted by the molten solder. The molten solder is absorbed in the opening 34 through the surfaces of the latch portions 73 and 83 and the coupling portions 74 and 84 and side wall of the opening 34. As shown in FIG. 7, the molten solder 36 is absorbed over the main face 31a of the substrate 31. The fillets are formed on the main face 31a of the substrate 31 to cover the main face 31a and the coupling portions 74 and 84. The fillets are formed on the rear face 31b of the substrate 31 to cover the rear face 31b and the latch portions 73 and 83. Therefore, the retaining member 60 is also connected to the metal coating layer formed on the side wall and the periphery of the opening 34 through the solder 36.

The retaining member 60 includes the base portion 61 and the first leg portion 62, i.e., the first leg portions 72 and 82, which are made of the same metal plate. The retaining member 60 further includes a latch portion 63, i.e., the latch portions 73 and 83, which is passed through the opening 34 and disposed on the rear face 31b of the substrate 31 at the periphery of the opening 34 in the retaining state. A spring portion 65, i.e., the spring portions 75 and 85, which is connected to the latch portion 63 through a coupling portion 64, i.e., the coupling portions 74 and 84, is displaced. Thereby, the latch portion 63 is passed through the opening 34 to be disposed on the rear face 31b of the substrate 31. When external force for pulling the first leg portion 62 out of the opening 34, that is, external force for pulling the connector 50 out of the substrate 31, is acted, the latch portion 63 is latched on the rear face 31b of the substrate 31. Therefore, compared to the conventional retaining member, bearing force with respect to tensile is improved, and hereby, the retaining strength of the connector 50 to the substrate 31 can be increased. That is, the connector 50 can be made difficult to be unlatched from the substrate 31 before the terminal 51 is soldered.

The latch portion 63 latched on the substrate 31 and the spring portion 65 are disposed on different positions in the first leg portion 62, and the spring portion 65 can not be inserted into the opening 34. That is, the spring portion 65 is not latched on the substrate 31 by reactive force generated by the deformation of the spring portion 65. The spring portion 65 has spring property that can dispose the latch portion 63 on the rear face 31b of the substrate 31 when the latch portion 63 and the coupling portion 64 are inserted into the opening 34 and the latch portion 63 is passed through the opening 34. In other words, spring property that the edge portion of the latch portion 63 strongly contacts the side wall of the opening 34 when the latch portion 63 and the coupling portion 64 are inserted into the opening 34 is unnecessary. Thereby, inserting force of the latch portion 63 and the coupling portion 64 into the opening 34 can be decreased. In contrast to the conventional retaining member, in which the spring portion is latched on the side wall of the opening, damage of the side wall of the opening 34 or damage of the metal coating layer formed on the wall surface can be decreased. The spring portion 65 can also be designed freely.

In the present embodiment, the width W of the spring portion 65 is larger than the thickness T of the metal plate. Thereby, when the latch portion 63 and the coupling portion 64 are inserted into the opening 34 or when external force for pulling the first leg portion 62 out of the opening 34 is acted with the strength of the spring portion 65 increased, the deformation or the damage of the spring portion 65 can be suppressed.

In the present embodiment, the latch portion 63 is formed by only the die cutting process of the metal plate. Compared to the bending process, the deformation or the damage of the spring portion 65 can be suppressed. Thereby, the retaining strength of the connector 50 to the substrate 31 can be increased.

In the present embodiment, the substantially U-shaped spring portion 65 is used. By using the folded spring portion, the spring portion 65 can be lengthened in the extending direction, i.e., the longitudinal direction to increase the stroke of the spring portion 65. The latch portion 63 is lengthened, so that the latch portion 63 can be made difficult to be unlatched from the rear face 31b of the substrate 31. That is, pulling out of the first leg portion 62 from the opening 34, i.e., pulling out of the connector 50 from the substrate 31, can be suppressed.

In the present embodiment, the retaining portion 60 includes the pair of first leg portions 72 and 82 extended in the same direction from the base portion 61, and the first leg portions 72 and 82 face each other. The extending direction of the latch portion 73 of the first leg portion 72 from the coupling portion 74 is opposite to the extending direction of the latch portion 83 of the first leg portion 82 from the coupling portion 84. As described above, in case that multiple first leg portions 72 and 82 are extended from one base portion 61, the retaining strength of the connector 50 to the substrate 31 can be increased compared to the case that only one first leg portion is extended from a base portion 61. Since the extending direction of the latch portion 73 is opposite to the extending direction of the latch portion 83, unsteadiness to the substrate 31 can be suppressed. Thereby, the latch portions 73 and 83 can be made difficult to be unlatched from the rear face 31b of the substrate 31. Particularly, in the present embodiment, since the extending direction of the latch portion 73 is opposite to the extending direction of the latch portion 83, unsteadiness to the substrate 31 can be suppressed effectively.

In the present embodiment, the opening 34, into which the first leg portions 72 and 82 of the retaining member 60 are inserted, has the long hole shape with extended in one direction. The latch portion 73 of the first leg portion 72 is extended from the coupling portion 74 in the longitudinal direction of the opening 34, and the latch portion 83 of the first leg portion 82 is extended from the coupling portion 84 in the longitudinal direction of the opening 34. The extended direction of the latch portion 73 is opposite to the extended direction of the latch portion 83. The latch portions 73 and 83 are disposed at the periphery of the opening 34 in the longitudinal side on the rear face 31b of the substrate 31. In this manner, the opening 34 is formed to have the long hole shape, the coupling portions 74 and 84 can be twisted widely when the first leg portions 72 and 82 are inserted into the opening 34 compared to a circular opening having the same cross section with the opening 34. That is, reactive force of the spring portions 75 and 85 decreases, and inserting force of the latch portions 73 and 83 and the coupling portions 74 and 84 to the opening 34 can be decreased. Therefore, when the latch portions 73 and 83 and the coupling portions 74 and 84 are inserted into the opening 34, the damage of the side wall of the opening 34 can be decreased. In addition, the longitudinal direction of the opening 34 is substantially parallel to the latitudinal direction, i.e., the front-rear direction, of the housing 52 of the connector 50. Therefore, the arrangement space of wiring on the substrate 31 can be easily set.

In the present embodiment, the coupling portion 64 does not contact the side wall of the opening 34 in the retaining state. That is, there is a clearance between the outer surface of the coupling portion 64 and the opening 34. Thus, when the flow soldering is performed, it becomes easy for the molten solder to be absorbed through the clearance by the capillary action. Therefore, reliability of the connection of the retaining member 60 to the substrate 31 or the metal coating layer through the solder can be increased.

Second Embodiment

Next, a second embodiment of the present invention will be described with reference to FIG. 8 to FIG. 11.

Figure 8:
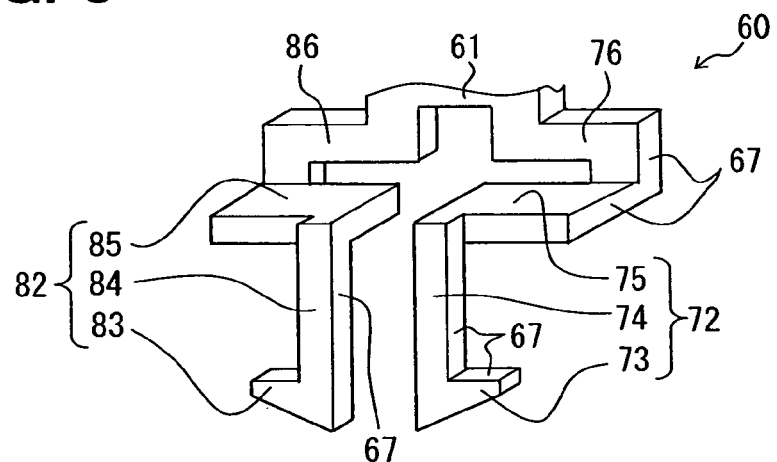
FIG. 8 is a perspective view showing a structure of a retaining member according to a second embodiment.

Although the spring portion 65 of the first embodiment is substantially U-shaped, the spring portion 65 may be an arbitrary form as long as the latch portion 63 and the coupling portion 64 can be inserted into the opening 34 and the latch portion 63 can be disposed on the rear face 31b of the substrate 31 by the displacement of the spring portion 65. In the present embodiment, as shown in FIG. 8, a flat plate spring is used as the spring portion 65. The pair of the first leg portions 72 and 82 is extended form the same base portion 61.

Specifically, taking one first leg portion 72 as an example, the bonding portion 76 having a crank shape is extended downwardly from the substantially rectangular flat plate-like base portion 61 in the same plane with the base portion 61. The bonding portion 76 is bent substantially 90 degrees so that the flat plate spring portion 75 is extended from the bonding portion 76. The spring portion 75 is substantially parallel to the main face 31a of the substrate 31 before the spring portion 75 is displaced. The spring portion 75 is bent substantially 90 degrees so that the coupling portion 74 is extended from the spring portion 75 as the first embodiment. The latch portion 73 is extended from the coupling portion 74 in the front-rear direction in the same plane with the lower end of the linear coupling portion 74. That is, elements other than the spring portion 75 and the bonding portion 76 are same as the elements shown in the first embodiment.

Figure 9:
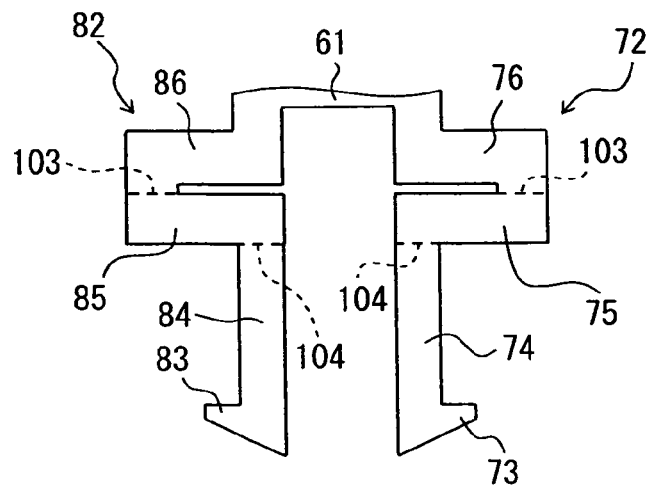
FIG. 9 is an extended view of a first leg portion of the retaining member shown in FIG. 8.

A flat metal plate is punched out in the die cutting process and bent partially so that the retaining member 60 is formed. The flat metal plate is punched out to have a shape as shown in FIG. 9. In the step, the bonding portions 76 and 86, the spring portions 75 and 85, the coupling portions 74 and 84, and the latch portions 73 and 83 are disposed in the same plane with the base portion 61. Boundaries 103 between the bonding portion 76 and the spring portion 75 and between the bonding portion 86 and the spring portion 85 are curved substantially 90 degrees with respect to the flat plate retaining member 60. Boundaries 104 between the spring portion 75 and the coupling portion 74 and between the spring portion 85 and the coupling portion 84 are curved substantially 90 degrees in the opposite direction from the curved direction at the boundaries 103. Thereby, the retaining member 60 shown in FIG. 8 is made from one metal plate. That is, the latch portions 73 and 83 are formed by only the die cutting process without the bending process.

The case that the flat plate spring portion 65, i.e., the pair of the spring portions 75 and 85, is used will be described. When the retaining member 60, i.e., the connector 50, is pushed into the substrate 31 and the latch portions 73 and 83 contact the substrate 31, the wedge-shaped latch portions 73 and 83 are displaced, i.e., the elastically deformed, with a portion supported by the base portion 61 and the bonding portions 76 and 86 as a fulcrum point. Thereby, the latch portions 73 and 83 proceed to the inside of the opening 34 along slopes of the latch portions 73 and 83. The connection portions of the spring portions 75 and 85 with each of the coupling portions 74 and 84 are displaced upwardly. The spring portions 75 and 85 are displaced so that the wedge-shaped latch portions 73 and 83 are inserted into the opening 34. The coupling portions 74 and 84 hardly perform the elastic deformation and are twisted with respect to the retaining state of the coupling portions 74 and 84. That is, the spring portions 75 and 85 are displaced so that the coupling portions 74 and 84 are twisted and the latch portions 73 and 83 are inserted into the opening 34. Edge portions of the latch portions 73 and 83 contact the side wall of the opening 34 by reactive force or restoring force generated by the elastic deformation of the spring portions 75 and 85. The retaining portion 60 is further pushed into the opening 34 so that the latch portions 73 and 83 are passed through the opening 34. Thereby, at least a part of the latch portions 73 and 83 is disposed at the periphery of the opening 34 on the rear face 31b of the substrate 31 by reactive force of the spring portions 75 and 85. As described above, the flat plate spring can be used as the spring portion 65. When the flat plate spring portion 65 is used, the bending process, which is necessary for the substantially U-shaped spring portion 65, becomes unnecessary.

Figure 10:
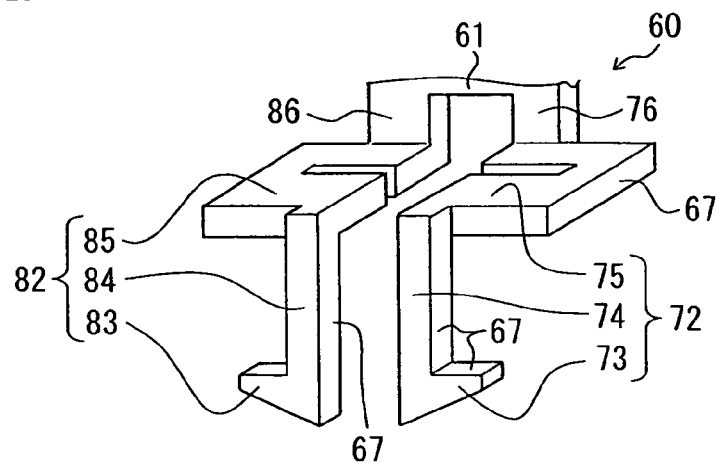
FIG. 10 is a perspective view showing a modification of the retaining member.
Figure 11:
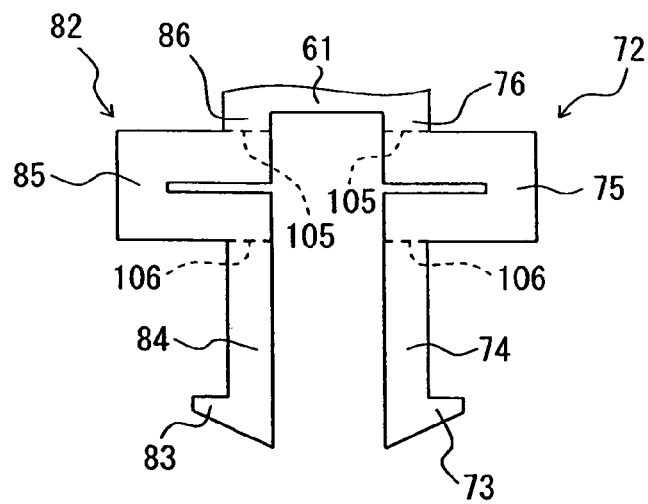
FIG. 11 is an extended view of the first leg portion of the retaining member shown in FIG. 10.

The spring portions 75 and 85 shown in FIG. 8 are linear in the extending direction, i.e., in the longitudinal direction. However, the folded spring may be used as the flat plate spring portion such as the substantially U-shaped spring portion 65 as shown in FIG. 10. In case that the flat plate spring or the folded spring is used, the amount of displacement, i.e., stroke of the spring portion 65 can be increased by lengthening the spring length in the extending direction. In addition, a meandering shape may be used as the spring portion 65. The retaining member 60 shown in FIG. 10 is formed as follows. The flat metal plate is punched out to have a shape as shown in FIG. 11. Boundaries 105 between the bonding portion 76 and the spring portion 75 and between the bonding portion 86 and the spring portion 85 are curved substantially 90 degrees, and boundaries 106 between the spring portion 75 and the coupling portion 74 and between the spring portion 85 and the coupling portion 84 are curved substantially 90 degrees in the opposite direction from the curved direction at the boundaries 105.

Third Embodiment

Next, a third embodiment of the present invention will be described with reference to FIG. 12 to FIG. 13B.

Figure 12:
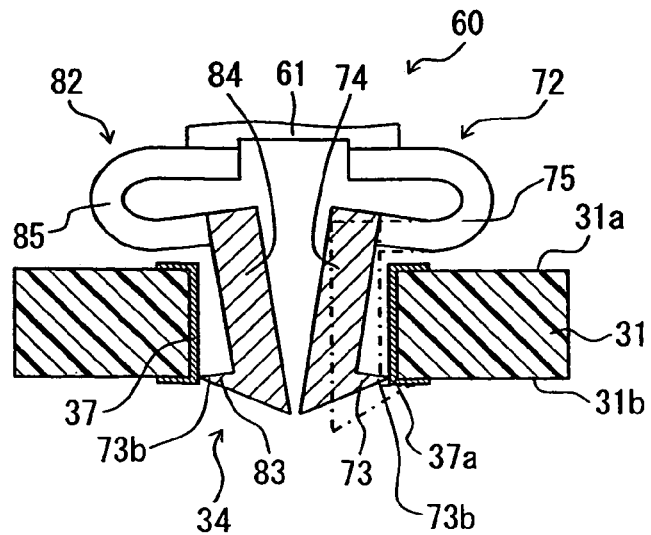
FIG. 12 is a partially cross sectional view showing a damage of a metal coating layer by a latch portion.

FIG. 12 shows that an edge portion 73b of the latch portion 63, i.e., the pair of latch portions 73 and 83, is angular-shaped, that is, an angle below 90 degrees. When the first leg portion 62, i.e., the pair of first leg portions 72 and 82, is inserted into the opening 34 and the latch portion 63 passes through the opening 34, a part of the latch portion 63 shifts to the outside from the opening 34 by reactive force or restoring force of the spring portion 65, i.e., the pair of spring portions 75 and 85. Therefore, the edge portion 73b may scratch a metal coating layer 37a formed on an end portion of the side wall of the opening 34 of a metal coating layer 37. The metal coating layer 37 is disposed on the side wall and at the periphery of the opening 34. In FIG. 12, a solid line represents the first leg portion 62 just before the latch portion 63 passes through the opening 34, and a dashed-dotted line represents the first leg portion 62 disposed on the rear face 31b of the substrate 31.

Figure 13A:
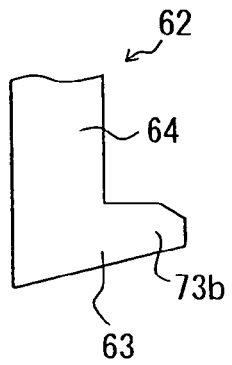
FIG. 13A is a plan view showing a structure of the latch portion in a retaining member according to a third embodiment.
Figure 13B:
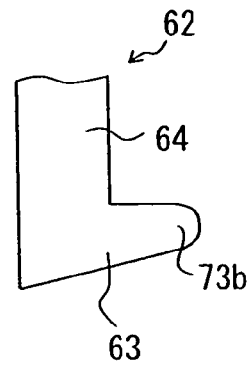
FIG. 13B is a plan view showing a structure of the latch portion in a retaining member according to a third embodiment.

FIG. 13A shows that the edge portion 73b, which is located farthest from the opening 34 in the retaining state, has a polygonal shape in the direction perpendicular to the up-down direction. The polygonal shape is obtained by connecting multiple angles more than 90 degrees. In FIG. 13A, three angels are connected. FIG. 13B shows that the edge portion 73b has a rounded shape. Thereby, pressure applied to the metal coating layer 37a decreases and damage of the metal coating layer 37 by the edge portion 73b can be suppressed.

Fourth Embodiment

Next, a fourth embodiment of the present invention will be described with reference to FIG. 14 to FIG. 16.

Figure 14:
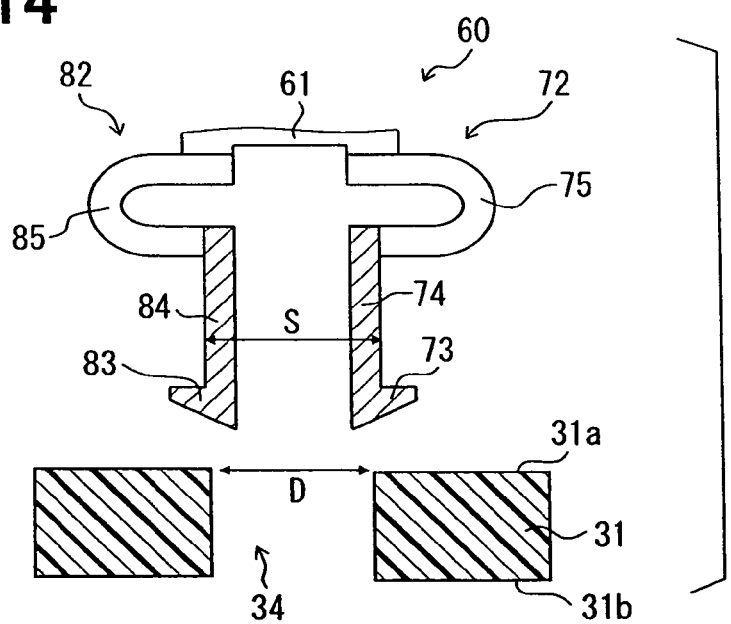
FIG. 14 is a partially cross sectional view showing a relationship between a first leg portion of a retaining member and an opening of a substrate in an electric control device according to a fourth embodiment.
Figure 15:
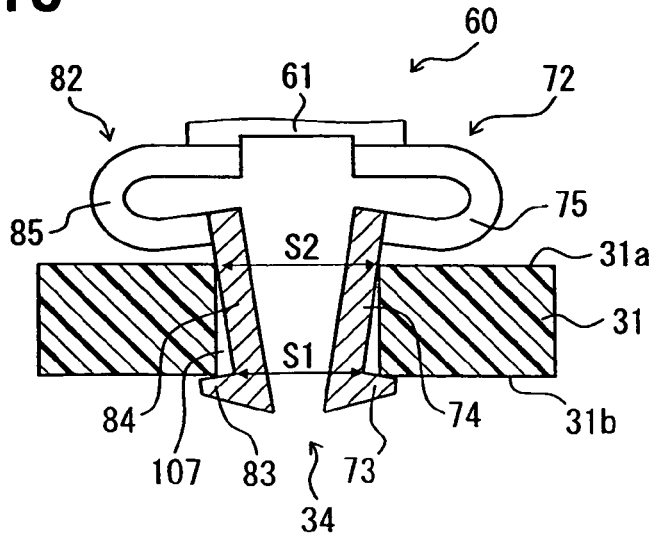
FIG. 15 is a partially cross sectional view showing the retaining member when a connector is retained on the substrate.

In contrast to the above-described embodiments, as shown in FIG. 14, the width S between the outer surface of the coupling portion 74 and the outer surface of the coupling portion 84 is larger than the width D of the opening 34 in the present embodiment. Thereby, as shown in FIG. 15, a part of the coupling portions 74 and 84 contacts the side wall of the opening 34 in the retaining state. Since the retaining member 60 contacts the substrate 31 in the retaining state, unsteadiness of the connector 50 to the substrate 31 can be suppressed. In this case, the spring portions 75 and 85 are displaced in the retaining state.

In case that the coupling portions 74 and 84, which are linear in the up-down direction, are used as shown in FIG. 14, the width S between the outer surface of the coupling portion 74 and the outer surface of the coupling portion 84 is not constant. That is, as shown in FIG. 15, a width S1, which is the width S at the rear face 31b of the substrate 31, is smaller than a width S2, which is the width S at the main face 31a of the substrate 31. Therefore, the retaining member 60 has clearances 107 between the outer surface of the coupling portion 74 and the opposing wall surface and between the outer surface of the coupling portion 84 and the opposing wall surface from the rear face 31b to the main face 31a in the opening 34. Thereby, when the flow soldering process is performed from the rear face 31b side, it becomes easy for the molten solder to be absorbed to the main face 31a side through the clearances 107 by the capillary action.

Figure 16:
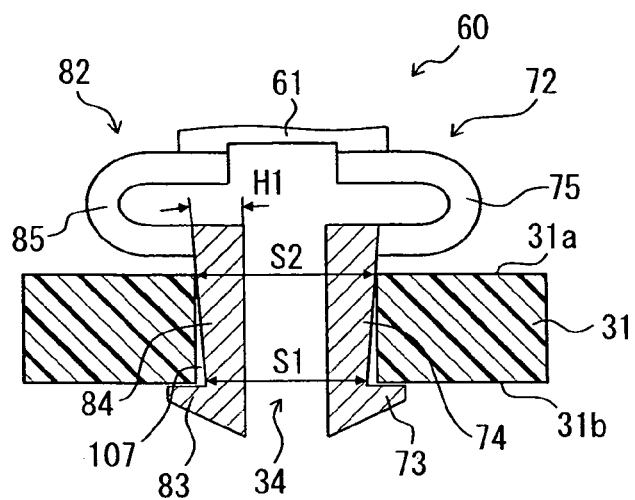
FIG. 16 is a cross sectional view showing a modified retaining member.

For example, as shown in FIG. 16, in case that a width H1 of each of the coupling portions 74 and 84 is broadened toward the connection portion with each of the spring portions 75 and 85 from the connection portion with each of the latch portions 73 and 83, the same effect can be obtained. In this case, the spring portions 75 and 85 may not be displaced in the retaining state.

Fifth Embodiment

Figure 17A:
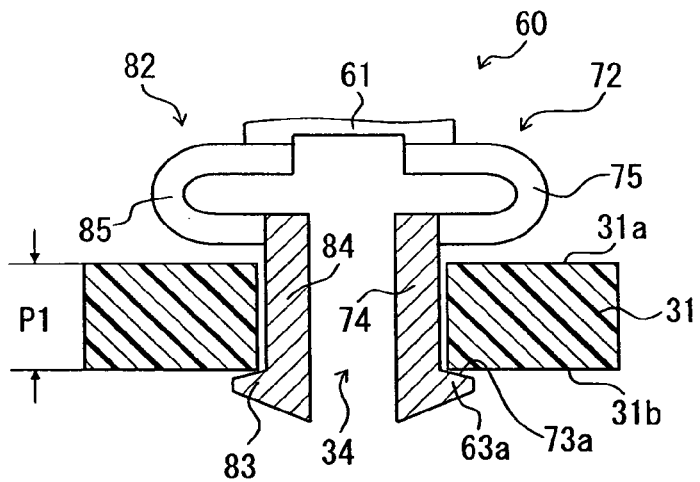
FIG. 17A is a partially cross sectional view showing a retaining member of an electric control device according to a fifth embodiment and a thickness of a substrate in FIG. 17A is P1.
Figure 17B:
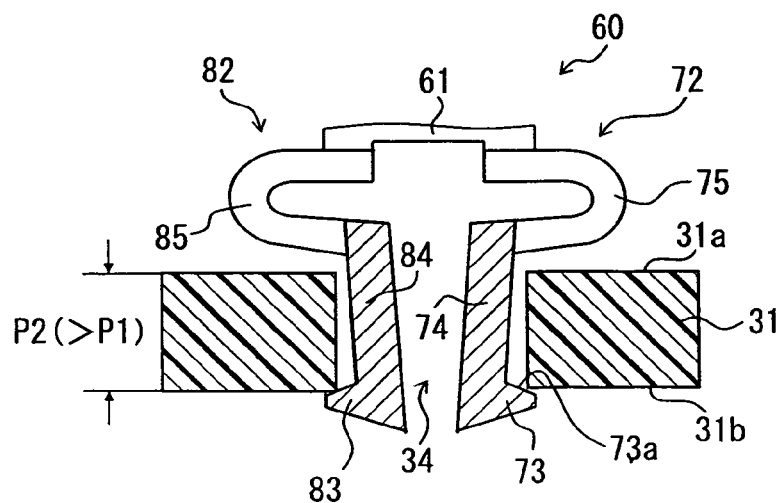
FIG. 17B is a partially cross sectional view showing a retaining member of an electric control device according to a fifth embodiment and a thickness of a substrate in FIG. 17B is P2.

Next, a fifth embodiment of the present invention will be described with reference to FIG. 17A and FIG. 17B.

In the above-described embodiments, the latch portion 63 has the wedge shape, and the surface of the latch portion 63 opposing the rear face 31b of the substrate 31 is substantially parallel to the rear face 31b. By using the retaining member 60 having such the latch portion 63, the thickness of the substrate 31 being capable of retaining the connector 50 is determined based on a distance between a locating portion, which is not shown in the drawings, of the housing 52 contacting the main face 31a of the substrate 31 and the opposing surface. On the other hand, the latch portions 63 have a tapered shape. As shown in FIG. 17A, the larger a distance between an opposing portion 73a facing the rear face 31b of the substrate 31 in the wedge-shaped latch portion 63 and the corresponding coupling portion 64 in the front-rear direction, the larger a distance between the opposing portion 73a and the main face 31a of the substrate 31 in the up-down direction in the retaining state.

In the above-described structure, although production variation and assembly variation in tolerance range are generated in the retaining member 60, the substrate 31 and the housing 52 in the up-down direction, the latch portion 63 can be latched on the rear face 31b of the substrate 31. In other words, unsteadiness between the substrate 31 and the connector 50 can be suppressed. In addition, the retaining members 60 having the same structure can be used as common members with respect to the substrates 31 having different thicknesses. As shown in FIG. 17B, the retaining member 60 used for the substrate 31 having a thickness P1 shown in FIG. 17A can be used for the substrate 31 having a thickness P2, which is larger than P1. The spring portion 65 is not displaced in FIG. 17A. The spring portion 65 is displaced in FIG. 17B.

Sixth Embodiment

Figure 18:
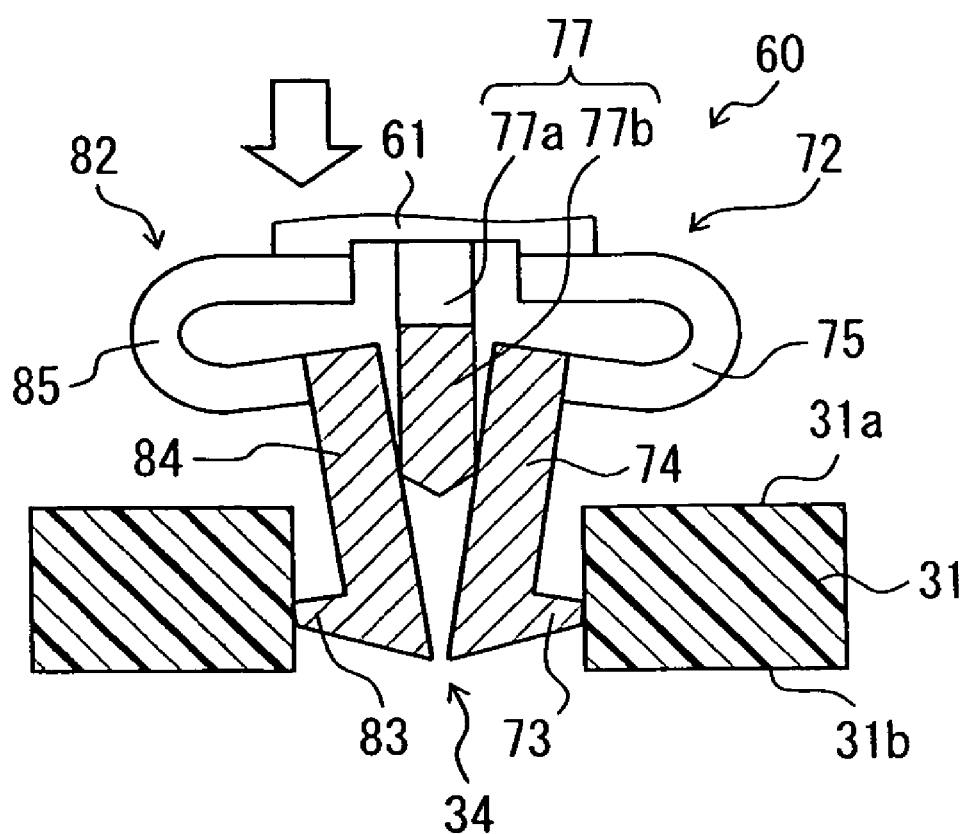
FIG. 18 is a partially cross sectional view showing a retaining member of an electric control device according to a sixth embodiment when a first leg portion is inserted into an opening.

Next, a sixth embodiment of the present invention will be described with reference to FIG. 18.

In the present embodiment, the retaining member 60 includes an inclination limiter 77 extending toward a portion between the pair of coupling portions 74 and 84, end portions of which oppose each other. The inclination limiter 77 is extended in the same direction with the pair of first leg portions 72 and 82. The inclination limiter 77 is located separately from the coupling portions 74 and 84 before the first leg portions 72 and 82 are inserted into the opening 34. The inclination limiter 77 includes a bonding portion 77a and a center portion 77b. The bonding portion 77a is extended from the base portion 61 and located in the same plane with the base portion 61. The center portion 77b is connected to a lower end of the bonding portion 77a. The center portion 77b is bent to be an inverted L-shaped and a part thereof is located in a region, in which the coupling portions 74 and 84 oppose. The center portion 77b is formed such that the end face 67 of the center portion 77b, which is located in the region, opposes to the inside end face 67 of the coupling portions 74 and 84.

Thereby, the inclination of the coupling portions 74 and 84 can be limited by the center portion 77b disposed between the pair of coupling portions 74 and 84. Even if the opening 34 and the pair of first leg portions 72 and 82 are out of predetermined positions when the first leg portions 72 and 82 are inserted into the opening 34, the coupling portions 74 and 84 contact the inclination limiter 77 and the coupling portions 74 and 84 can not incline widely. Thereby, the deformation and the damage of the first leg portions 72 and 82 can be suppressed. When the flow soldering is performed, the molten solder flows into a clearance between the coupling portion 74 and the center portion 77b and a clearance between the coupling portion 84 and the center portion 77b by the capillary action and it becomes easy for the molten solder to be absorbed over the main face 31a of the substrate 31. Since the inclination limiter 77 contacts the solder, the contact area between the solder and the retaining member increases. Therefore, bearing force with respect to tensile can be improved.

Seventh Embodiment

Next, a seventh embodiment of the present invention will be described with reference to FIG. 19 to FIG. 31B.

Figure 19:
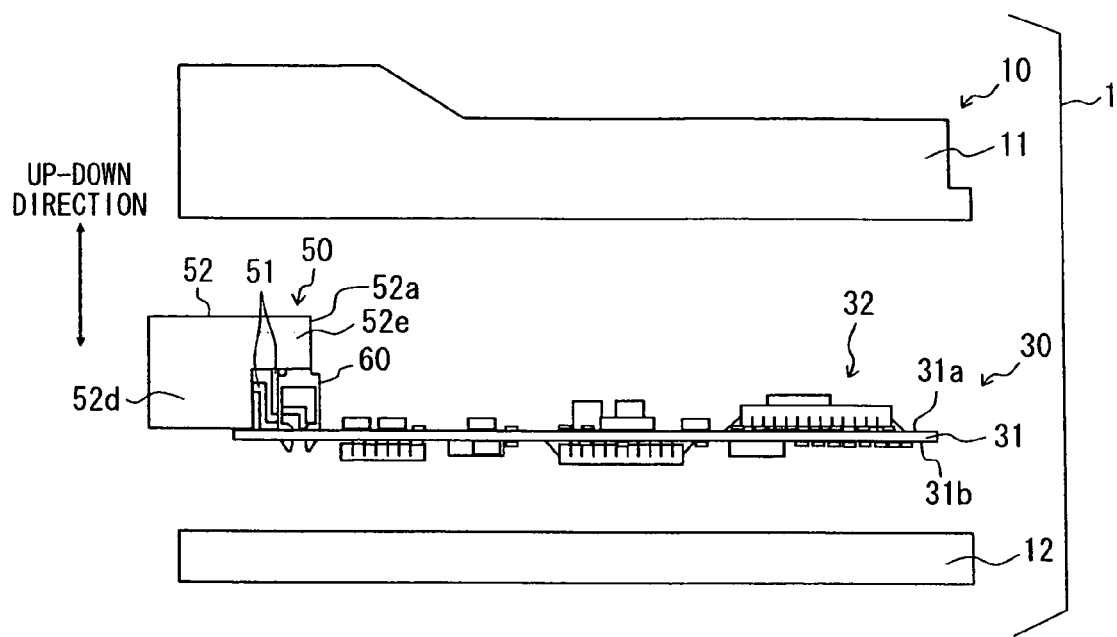
FIG. 19 is an exploded view showing a structure of an electric control device according to a seventh embodiment.

An electric control device 1 in FIG. 19 includes a circuit board 30, in which an electric component 32 is mounted on a substrate 31, a connector 50 including terminals 51, the housing 52 and retaining members 60 as a substantial part. Other than the above-described elements, the electric control device 1 includes a chassis 10 for holding the circuit board 30 and the connector 50.

The chassis 10 is made of metal material such as aluminum and iron or resin material, and the circuit board 30 and a part of the connector 50 are held inside the chassis 10. The chassis 10 may be configured from one element or multiple elements. In the present embodiment, as shown in FIG. 19, the chassis 10 is configured by two elements, that is, a box-shaped case 11 with one side opened, and a cover 12 for closing the one side of the case 11. The cover 12 is substantially rectangular plate-like shape and has a shallow bottom. By combining the case 11 with the cover 12, the chassis 10 including internal space for holding the circuit board 30 and the connector 50 is provided. A window portion, which is not shown in the drawings, for the connector 50 is provided in the chassis 10 or the case 11. The case 11 and the cover 12 are combined by screws, for example, to hold the circuit board 30. Then, the circuit board 30 and a part of the connector 50 including a connecting side to the circuit board 30 in the terminal 51 are held inside the chassis 10. The rest of the connector 50 including a connecting side to an external connector in the terminal 51 is exposed outside the chassis 10.

Figure 20:
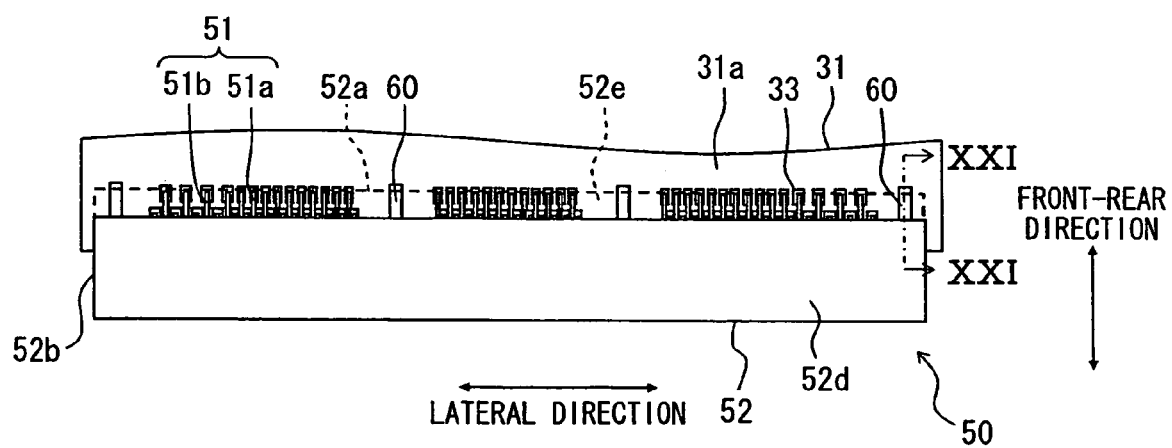
FIG. 20 is a plan view of a mounting portion, in which a connector is mounted on a substrate.

As shown in FIG. 19, the electric components 32 such as a microcomputer, a power transistor, a resistor and a capacitor are mounted on the substrate 31, in which wirings including lands as electrodes and via holes for connecting between the wirings are disposed, so that the circuit board 30 is provided. In the present embodiment, the connector 50 for electrically connecting the circuit board 30 to the external connector is mounted on the substrate 31 as one of the electric components 32. Multiple lands 33, which are arranged as multiple stages, are provided on a main face 31a of the substrate 31 not only in the lateral direction but also in the front-rear direction, as shown in FIG. 20. In FIG. 20, a part of a main body portion of the connector is shown by a broken line to show terminals and retaining members under the main body portion. Each of the lands 33 is connected to a mounting portion of the corresponding terminal 51, which is disposed on each of the lands 33, through solder, which is not shown in the drawings.

Figure 21:
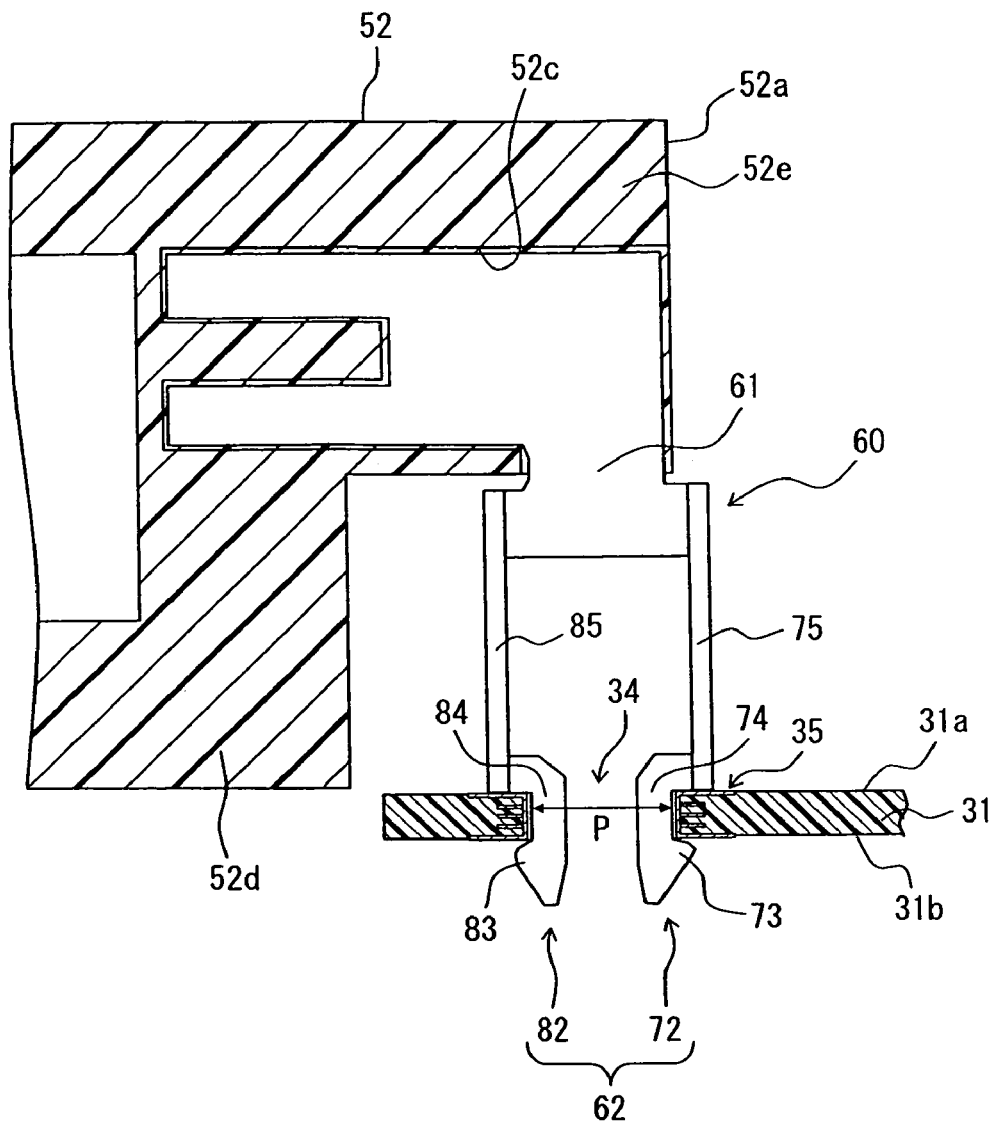
FIG. 21 is a partially cross sectional view along a line XXI-XXI in FIG. 20.
Figure 22:
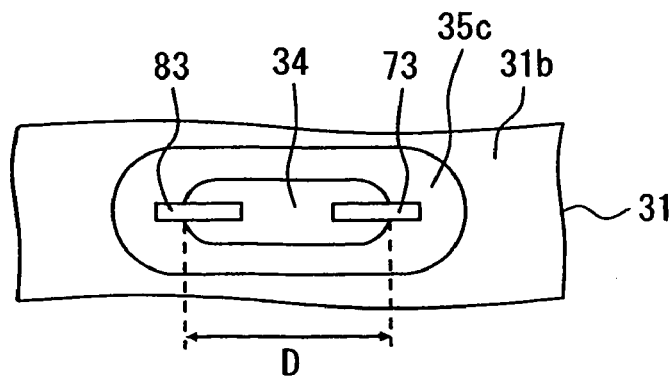
FIG. 22 is a plan view of FIG. 21, which is seen from a rear surface of the substrate.
Figure 24:
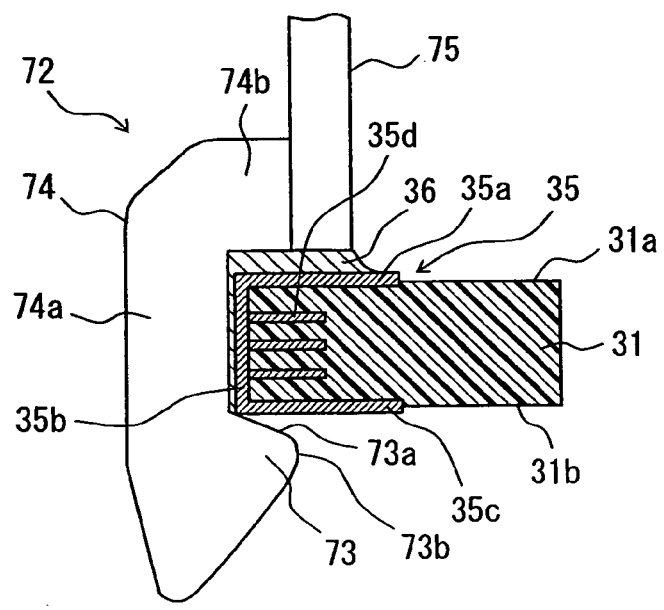
FIG. 24 is an enlarged partially cross sectional view showing an opening of the substrate when a first leg portion is inserted into the opening.

In the substrate 31, four openings 34 are provided at both end portions of the connector 50 and two portions between the both end portions of the connector 50. The openings 34 sandwich the lands 33 in the lateral direction. As shown in FIG. 21, the first leg portion 62, that is, a pair of first leg portions 72 and 82 of the retaining member 60 is inserted into the opening 34. In FIG. 21, the retaining member 60 is shown as a planer shape. The cross-sectional shape of the opening 34 may be taken an arbitrary form. In the present embodiment, as shown in FIG. 22, the length of the opening 34 in the front-rear direction is larger than that in the lateral direction. The opening 34 has a substantially elliptical cross-sectional shape, that is, a long hole shape with a diameter D in the front-rear direction. As shown in FIG. 21 and FIG. 22, the pair of first leg portions 72 and 82 is inserted into one opening 34. In addition, as shown in FIG. 21, FIG. 22 and FIG. 24, a dummy land 35 is formed at the periphery of the opening 34. The dummy land 35 does not provide an electrical connecting function due to patterning of conductive foil or plating. In FIG. 24, the retaining member 60 is shown as a planer shape. As shown in FIG. 24, the first leg portion 72 is connected to the dummy land 35 through solder 36. Although only the first leg portion 72 is shown in FIG. 24, the first leg portion 82 has the same structure with the first leg portion 72. The dummy land 35 includes a main face portion 35a provided at the periphery of the opening 34 on the main face 31a of the substrate 31, a wall surface portion 35b provided on a side wall of the opening 34, a rear face portion 35c provided at the periphery of the opening 34 on a rear face 31b of the substrate 31, and an inner layer portion 35d provided in an inner layer of the substrate 31. The solder 36 is disposed on the main face portion 35a and the wall surface portion 35b, and the solder 36 is connected to a coupling portion 74. The dummy lands 35 are provided in all the openings 34. By forming all the dummy lands 35 to have the same structures, each of the thicknesses of the substrate 31 at each of the forming regions of the dummy lands 35 may not be varied. Therefore, unsteadiness of the connector 50 to the substrate 31 can be suppressed.

Multiple terminals 51 made of a conductive material are arranged on the main face 31a of the substrate 31 along with the housing 52 made of an electrical insulating material, resin is used in the present embodiment, so that the connector 50 is provided. An end portion of one side of the terminal 51, which is extended from a front face 52a of the housing 52, is disposed on the corresponding land 33 as the mounting portion, and is electrically connected to the land 33 through solder, which is not shown in the drawings. Another end portion of the terminal 51, which is extended from a rear face of the housing 52, is exposed to the outside of the chassis 10, and is electrically connected to an external connector. That is, the terminal 51 having a surface mounting structure, which has only a surface mounting portion as the mounting portion of the land 33, is used as the terminal 51. As shown in FIG. 20, the terminal 51 having the surface mounting structure includes a signal terminal 51a for transmitting a signal and a power terminal 51b for transmitting electric power, which is thicker than the signal terminal 51a. A part of each of the terminals 51, which forms a planar shape along the main face 31a of the substrate 31, is retained so as not to interfere each other and arranged along the lateral direction of the housing 52, which has a substantially rectangular shape with elongated in the lateral direction.

As shown in FIG. 21, a groove portion 52c for the retaining member 60 is arranged at each of the four portions, that is, at the periphery of both end portions 52b and two portions between the both end portions 52b in the lateral direction, toward the rear face from the front face 52a. The retaining member 60 is inserted into the groove portion 52c from the front face 52a toward the rear face side. Thus, the retaining member 60 is fixed to the housing 52, consequently, to the connector 50 as the electric component. The housing 52 has a two-stage structure in the front-rear direction. In FIG. 19 to FIG. 21, reference numeral 52d denotes a rear step portion including a joint portion with the external connector, and reference numeral 52e denotes a front step portion including the front face 52a. The groove portion 52c opens toward the front face 52a of the front step portion 52e and downwardly, and the groove portion 52c is extended to the rear step portion 52d from the front step portion 52e.

Figure 23:
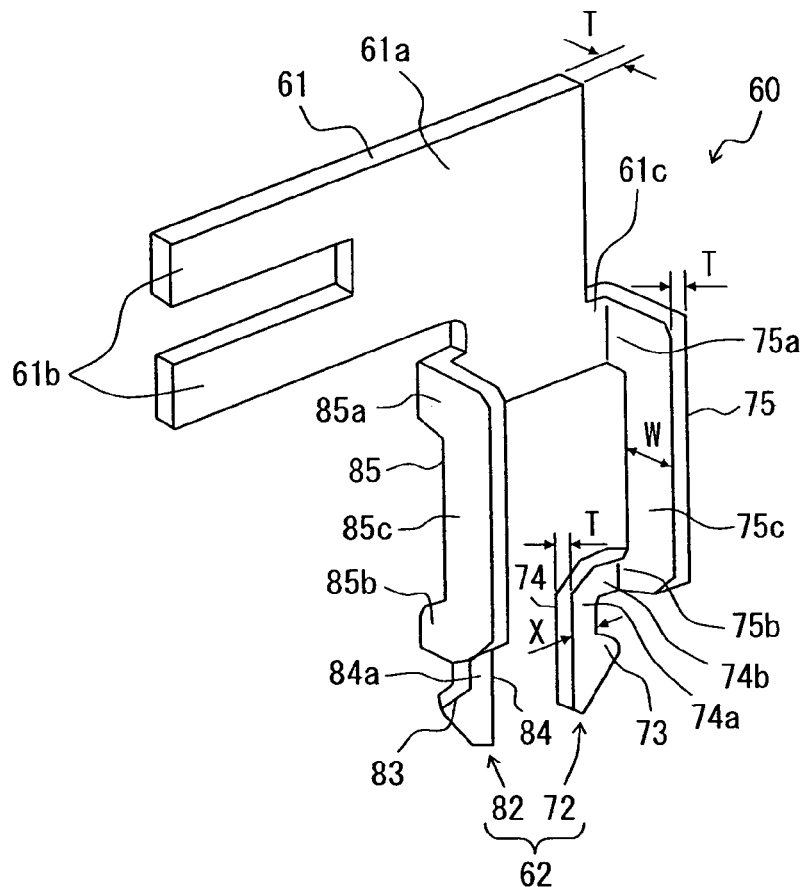
FIG. 23 is a perspective view showing a structure of a retaining member.

The retaining member 60 is inserted into the opening 34 of the substrate 31, and makes the connector 50 difficult to come out from the substrate 31. That is, the retaining member 60 retains the connector 50 on the main face 31a of the substrate 31. As shown in FIG. 23, a metal plate having a thickness T is processed to provide the retaining member 60 including a base portion 61 and the first leg portion 62, which are integrally formed.

The base portion 61 is a fixing portion of the retaining member 60 into the housing 52. In the present embodiment, the base portion 61 has a flat plate shape and the base portion 61 is inserted into and fixed to the groove portion 52c, which opens toward the front face 52a of the housing 52. As shown in FIG. 23, the base portion 61 includes an L-shaped portion 61a extending in the front-rear direction and the up-down direction, a bifurcated portion 61b extending to a rear face side of the housing 52 from an end portion of the base portion 61a in a portion extending in the front-rear direction of the L-shaped portion 61a, and a T-shaped portion 61c extending in the front-rear direction from an end portion of the L-shaped portion 61a at a lower face side, the end portion which opposes the substrate 31 in a portion extending in the up-down direction of the L-shaped portion 61a. The base portion 61 is inserted into and fixed to the groove portion 52c of the housing 52 with the bifurcated portion 61b as a lead and the T-shaped portion 61c as a bottom. In the retaining state, a position of an end surface of the L-shaped portion 61a at the front face 52a side is aligned with the front face 52a of the housing 52 or is disposed at the rear side of the housing 52 from the front face 52a. With respect to the base portion 61, the first leg portion 62 is extended downwardly, that is, toward the substrate 31.

The first leg portion 62 is a portion for retaining the connector 50 on the main face 31a of the substrate 31, and a part of the first leg portion 62 is inserted into the opening 34 of the substrate 31. In the present embodiment, the pair of first leg portions 72 and 82 is extended in a same direction, that is, downwardly from each of end portions of the T-shaped portion 61c of the base portion 61 in the front-rear direction.

In the first leg portions 72 and 82, one first leg portion 72 includes a latch portion 73 disposed on an end portion of the first leg portion 72, i.e., a lower end of the first leg portion 72. With the connector 50 retained on the substrate 31, i.e., in the retaining state, a part of the latch portion 73 is disposed at the periphery of the opening 34 on the rear face 31b of the substrate 31. The latch portion 73 is connected to an end portion of the coupling portion 74, a part of which is disposed in the opening 34 in the retaining state. Another end portion of the coupling portion 74 is connected to a spring portion 75 disposed on the main face 31a of the substrate 31 in the retaining state. The spring portion 75 is deformed when the latch portion 73 and the coupling portion 74 are inserted into the opening 34. Thereby, the coupling portion 74 is twisted with respect to the retaining state of the coupling portion 74 and the latch portion 73 is inserted into the opening 34. A width W of the spring portion 75 in the latitudinal direction is larger than the thickness T of the metal plate, and the spring portion 75 deforms elastically in the plate thickness direction. The spring portion 75 extends in the substantially same direction with the coupling portion 74, a portion between a coupling end of the spring portion 75 with the coupling portion 74 and a coupling end of the spring portion 75 with the base portion 61 is a flat plate before the spring portion 75 is displaced. The thickness direction of the flat plate portion is substantially parallel to a direction of the latch portion 73 extended from the coupling portion 74 before the displacement of the spring portion 75. An opposite end portion of the coupling end of the coupling portion 74 in the spring portion 75 is connected to the base portion 61. In a plane substantially perpendicular to the plate thickness of the flat plate portion, the latitudinal direction is a direction substantially perpendicular to the longitudinal direction connecting the coupling portion 74 and the base portion 61, that is, an extending direction of the spring portion 75.

The width W of the spring portion 75 in the latitudinal direction is substantially constant in the longitudinal direction. The flat plate portion of the spring portion 75 is substantially planar U-shaped, and includes parallel portions 75a and 75b and a straight portion 75c. The straight portion 75c connects the parallel portion 75a and the parallel portion 75b and is longer than the parallel portions 75a and 75b. An end portion of the parallel portion 75a connects to an end portion of the T-shaped portion 61c of the base portion 61 at a front side, and an end portion of the parallel portion 75b connects to the coupling portion 74. The spring portion 75 is curved substantially 90 degrees at the same side with respect to the flat plate base portion 61 and the coupling portion 74. In case that the spring portion 75 does not contact the base portion 61 and the coupling portion 74 after the displacement of the spring portion 75, the spring portion 75 may not include the parallel portions 75a and 75b.

A part of the coupling portion 74 other than the coupling end with the spring portion 75 and the latch portion 73 are formed integrally to have a flat plate shape, and the plate thickness of the flat plate coupling portion 74 is substantially parallel to the plate thickness of the base portion 61. Thereby, the plate thickness of the spring portion 75 becomes substantially parallel to the extending direction of the latch portion 73 from the coupling portion 74 before the displacement of the spring portion 75, and becomes substantially perpendicular to the plate thickness of the base portion 61 and the plate thickness of the coupling portion 74. Specifically, length of the parallel portions 75a and 75b from the straight portion 75c become substantially same, and the coupling portion 74 and the latch portion 73, which have a flat plate shape formed integrally, and the flat plate base portion 61 are arranged at same positions in the plate thickness of the base portion 61 before the displacement of the spring portion 75.

In addition, as shown in FIG. 23, a width X of the coupling portion 74 in the latitudinal direction is larger than the plate thickness T of the metal plate, and the plate thickness of the coupling portion 74 is substantially perpendicular to the plate thickness of the spring portion 75. Thereby, the coupling portion 74 is rigid so as to be hardly deformed when the latch portion 73 and the coupling portion 74 are inserted into the opening 34. The flat plate portion of the coupling portion 74 is substantially planar L-shaped, and a length of a longitudinal portion 74a of the coupling portion 74 in the up-down direction is adjusted so that a latitudinal portion 74b of the coupling portion 74 and the spring portion 75 do not contact the main face 31a of the substrate 31 until at least the latch portion 73 is disposed on the rear face 31b of the substrate 31. In a plane substantially perpendicular to the plate thickness of the flat plate portion, the latitudinal direction of the coupling portion 74 is a direction substantially perpendicular to the longitudinal direction, i.e., the extending direction of the coupling portion 74, for connecting the spring portion 75 to the latch portion 73.

The latch portion 73 extends in the front-rear direction from a lower end of the longitudinal portion 74a with respect to the coupling portion 74. In other words, the latch portion 73 extends substantially parallel to the direction, in which the latitudinal portion 74b of the coupling portion 74 extends. As shown in FIG. 21, in the retaining state, the extending direction of the latch portion 73 is substantially parallel to the rear face 31b or the main face 31a of the substrate 31. A width of the latch portion 73 in the up-down direction decreases as a distance of the latch portion 73 from the coupling end of the coupling portion 74 in the front-rear direction increases, that is, the latch portion 73 has a wedge shape. At least a part of the latch portion 73 is disposed or opposed on the rear face 31b of the substrate 31 in the retaining state.

As shown in FIG. 24, the larger a distance between an opposing portion 73a facing the rear face 31b of the substrate 31 in the wedge-shaped latch portion 73 and the corresponding coupling portion 74 in the front-rear direction, the larger a distance between the opposing portion 73a and the main face 31a of the substrate 31 in the up-down direction in the retaining state. The opposing portion 73a has a tapered shape. Thereby, although production variation and assembly variation in tolerance range are generated in the retaining member 60, the substrate 31 and the housing 52 in the up-down direction, the latch portion 73 can be latched on the rear face 31b of the substrate 31. Since an end surface, which opposes to the substrate 31, of the latitudinal portion 74b or an end surface, which opposes to the substrate 31, of the parallel portion 75b contacts the main face 31a of the substrate 31, the substrate 31 is sandwiched between the latitudinal portion 74b or the parallel portion 75b and the latch portion 73. Compared to the structure that the opposing portion 73a is substantially parallel to the rear surface 31b of the substrate 31, unsteadiness between the substrate 31 and the connector 50 can be suppressed. In addition, retaining members 60 having the same structure can be used as common members with respect to the substrates 31 having different thicknesses.

The edge portion of the latch portion 73 may be angular-shaped, that is, an angle below 90 degrees. When the first leg portion 72 is inserted into the opening 34 and passes through the opening 34, a part of the latch portion 73 shifts to the outside from the opening 34 by reactive force or restoring force of the spring portion 75. Therefore, the edge portion may scratch a side wall of the opening 34. Specifically, in case that the wall surface portion 35b of the dummy land 35 made by plating is disposed on the side wall of the opening 34, the edge portion may scratch the wall surface portion 35b. As shown in FIG. 24, an edge portion 73b, which is located farthest from the opening 34 in the retaining state, has a rounded shape. Thereby, pressure applied to the side wall of the opening 34 decreases and damage of the side wall of the opening 34 by the edge portion 73b can be suppressed. The latch portion 73 having a polygonal shape, which is obtained by connecting multiple angles more than 90 degrees, may be used other than the rounded shape. Moreover, a peripheral shape along the main face 31a of the edge portion in the latch portion 73 may be arcuate shape. Thereby, damage of the side wall of the opening can be suppressed. In case that the coupling portion 74 contacts the side wall of the opening 34, an end surface, which opposes to the side wall of the opening 34, of the coupling portion 74 may be arcuate shape.

The first leg portion 82 extends in the same direction with the first leg portion 72 from the base portion 61, and the first leg portion 82 includes a latch portion 83, a coupling portion 84 and a spring portion 85 same as the first leg portion 72. The first leg portion 82 is line symmetrical to the first leg portion 72 in the extending direction of the first leg portions 72 and 82.

The direction of the latch portion 73 extended from the coupling portion 74 in the first leg portion 72 is opposite to the direction of the latch portion 83 extended from the coupling portion 84 in the first leg portion 82. As shown in FIG. 22, the latch portion 73 is disposed on the rear face 31b of the substrate 31 at one side in the longitudinal direction i.e., in the front-rear direction of the opening 34, and the latch portion 83 is disposed on the rear face 31b of the substrate 31 at another side, with respect to a cross section of the substantially ellipsoidal-shaped opening 34, which is elongated in the front-rear direction. The width X in the latitudinal direction of each of the coupling portions 74 and 84 is smaller than half the length of a width D, i.e., an inner diameter of the opening 34, in which the latch portions 73 and 83 are latched in the front-rear direction. Lengths of the first leg portions 72 and 82 are adjusted such that the first leg portions 72 and 82 do not contact each other when inserting into the opening 34. As shown in FIG. 21, when the spring portions 75 and 85 are not displaced, a width P between an outer surface of the coupling portion 74 and an outer surface of the coupling portion 84 is smaller than the width D of the opening 34. That is, when a part of each of the latch portions 73 and 83 is disposed on the rear face 31b of the substrate 31, the coupling portions 74 and 84 do not contact the side wall of the opening 34 so that there are clearances between the outer surface of the coupling portion 74 and the opposing wall surface and between the outer surface of the coupling portion 84 and the opposing wall surface.

As shown in FIG. 20, the four retaining members 60 are fixed to the housing 52. The four retaining members 60 are disposed symmetrically, that is, with respect to a center of the housing 52 in the lateral direction, the two retaining members 60 are disposed at a left side and other two retaining members 60 are disposed at a right side. Each of the retaining members 60 is disposed such that the plate thickness direction of the base portion 61 becomes substantially parallel to the longitudinal direction of the housing 52 at the end portion 52b of the housing 52 in the longitudinal direction, and the spring portions 75 and 85 are bent with respect to the base portion 61 so that the spring portions 75 and 85 are bent toward the outside of the end portion 52b disposed at a nearer side in the housing 52.

Figure 25:
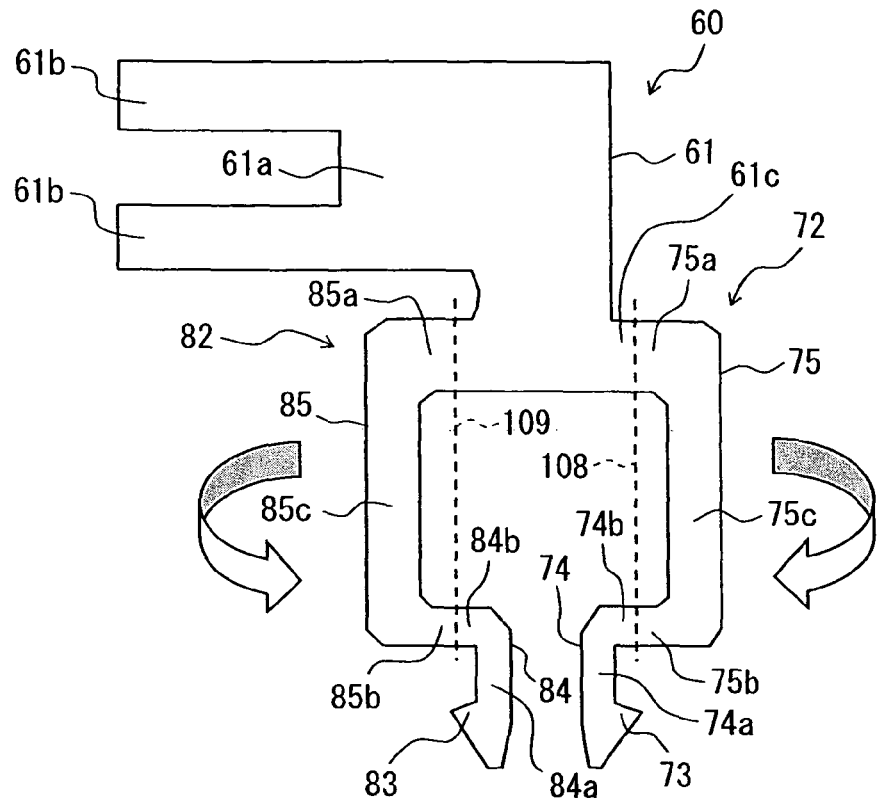
FIG. 25 is an extended view of the retaining member for showing a manufacturing method.

A flat metal plate having a thickness T is punched out and bent partially so that the retaining member 60 is provided. The flat metal plate is punched out to have a shape as shown in FIG. 25 firstly. In the step, the spring portions 75 and 85, the coupling portions 74 and 84, and the latch portions 73 and 83 are disposed in the same plane with the base portion 61. The spring portion 75 is bent substantially 90 degrees to the same side with respect to the base portion 61, the coupling portion 74 and the latch portion 73 with a straight broken line in FIG. 25 as a bending position. Thereby, a length of the parallel portion 75a from the straight portion 75c and a length of the parallel portion 75b from the straight portion 75c become substantially same. The spring portion 85 is bent substantially 90 degrees in a direction which closes to the spring portion 75 with respect to the base portion 61, the coupling portion 84 and the latch portion 83 with the straight broken line in FIG. 25 as a bending position. Thereby, a length of the parallel portion 85a from the straight portion 85c and a length of the parallel portion 85b from the straight portion 85c become substantially same. Lengths of each of the spring portions 75 and 85 are substantially the same. As described above, one metal plate is punched out to have a predetermined shape, and each of the spring portions 75 and 85 are bent so that the retaining member 60 shown in FIG. 23 can be formed. In the present embodiment, the latch portions 73 and 83 are formed by only the die cutting without the bending process.

Figure 26:
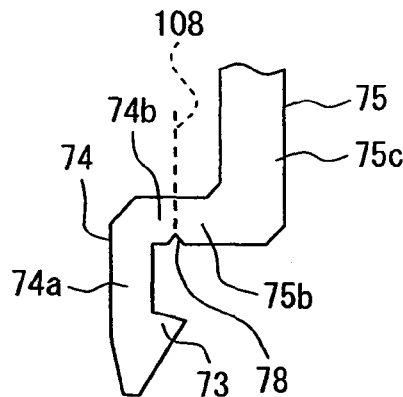
FIG. 26 is an enlarged view of the periphery of a coupling portion in FIG. 25.

When the bending process is performed to the metal plate, a convex portion may be formed at the bent position. Thus, as shown in FIG. 26, a concave portion 78 is formed in advance at a connection portion of the latitudinal portion 74b and the parallel portion 75b at the substrate 31 side when the metal plate is punched out. Thereby, when the spring portion 75 is bent, generating of the convex portion at the connection portion can be suppressed. The retaining member 60 can be disposed on the main face 31a of the substrate 31 with an end surface of the latitudinal portion 74b at the substrate side substantially parallel to the substrate 31. Although only the first leg portion 72 is shown in FIG. 26, the first leg portion 82 has the same structure as the first leg portion 72.

Next, a method for retaining the connector 50 on the substrate 31 by the retaining member 60 will be described. In the present embodiment, the terminal having the surface mounting structure, which is connected to the land 33 formed on the main face 31a of the substrate 31, is used as the terminal 51. The retaining member 60 and the terminal 51 are mounted on the substrate 31 together by the reflow soldering, and the retaining member 60 can be strongly fixed to the substrate 31. Thereby, manufacturing steps can be decreased by mounting the retaining member 60 together with the other electric components.

Figure 27:
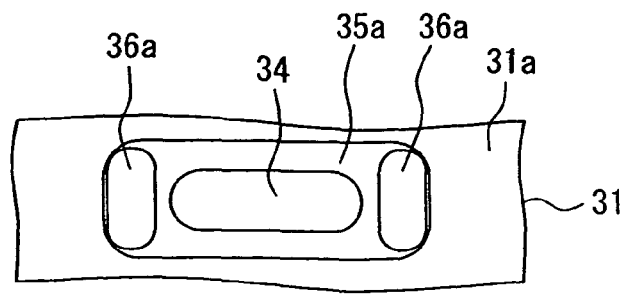
FIG. 27 is a plan view showing an application position of solder to the substrate.

Firstly, the base portion 61 of the retaining member 60 is inserted into and fixed to the groove portion 52c. The soldering paste is applied on the land 33 and the dummy land 35 by screen printing before the connector 50 with the retaining member 60 fixed to the inside thereof, is mounted on the substrate 31. When the soldering paste is applied in the opening 34, i.e., on the wall surface portion 35b of the dummy land 35, and first leg portions 72 and 82 are inserted into the opening 34, the soldering paste in the opening 34 shifts toward the rear face 31b so that the soldering paste may drop. In addition, when the latch portions 73 and 83 are disposed at the periphery of the opening 34 at the rear face 31b of the substrate 31 by reactive force of the spring portions 75 and 85, the soldering paste may be flicked off. Thereby, a reflow furnace may be contaminated by the soldering paste. Therefore, preferably, the soldering paste is applied on only the main face portion 35a of the dummy land 35, and more preferably, the soldering paste is applied on only a portion far from the opening 34 of the main face portion 35a. As shown in FIG. 27, the soldering paste 36a is applied on only the portion far from the opening 34 on the main face portion 35a.

Figure 28:
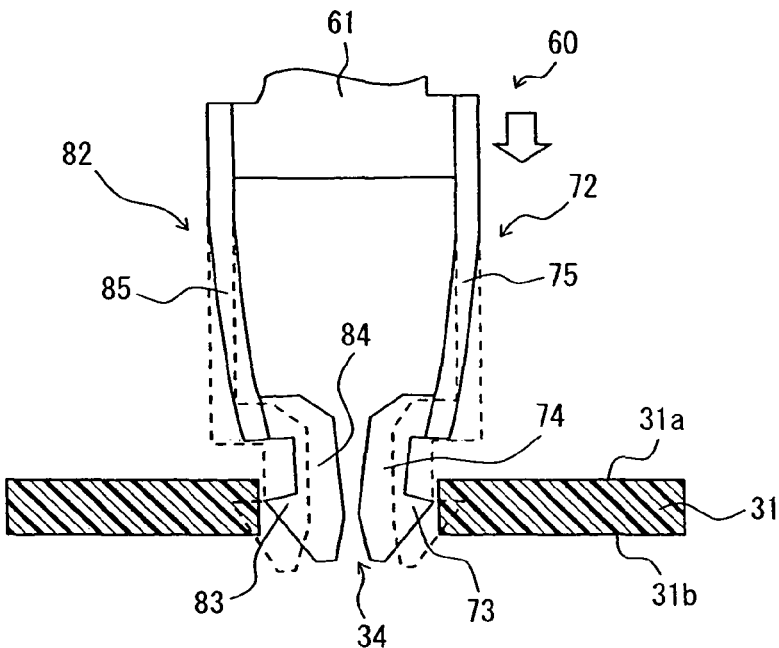
FIG. 28 is a partially cross sectional view showing the retaining member when the first leg portion is inserted into the opening.

As shown in FIG. 28, the latch portions 73 and 83 of the retaining member 60 are inserted into the opening 34 in a direction toward the rear face 31b from the main face 31a, i.e., in a direction shown by an outline arrow in FIG. 28. In FIG. 28, a land of the substrate is not shown for convenience, and the retaining member is shown as a planer shape. A distance between an end of the edge portion of the latch portion 73 and an end of the edge portion of the latch portion 83 before inserting is longer than the width D of the opening 34. Each of the latch portions 73 and 83 has the wedge shape, and spring portions 75 and 85 can deform elastically in the plate thickness direction. Therefore, the retaining member 60 is inserted into the opening 34 in the direction of the outline arrow in FIG. 28 and the latch portions 73 and 83 contact the substrate 31, the spring portions 75 and 85 are displaced with the connection portions with the base portion 61 side as a fulcrum point. Thereby, the wedge-shaped latch portions 73 and 83 proceed into the inside of the opening 34 along slopes of the latch portions 73 and 83. As shown in FIG. 28, the connection portions with the coupling portions 74 and 84 sides, which are downside portions of the flat plate-like spring portions 75 and 85, are displaced in the plate thickness direction of the spring portions 75 and 85 and in a direction, in which the spring portions 75 and 85 move toward each other, in other words, an inward direction of the longitudinal direction of the opening 34 along the main face 31a of the substrate 31. The wedge-shaped latch portions 73 and 83 are inserted into the opening 34 by the displacement of the spring portions 75 and 85. Since the plate thickness direction of the coupling portions 74 and 84 is substantially perpendicular to the plate thickness direction of the spring portions 75 and 85, the coupling portions 74 and 84 hardly deform elastically and are twisted with respect to the retaining state of the coupling portions 74 and 84. That is, the spring portions 75 and 85 are displaced such that the coupling portions 74 and 84 are twisted, and the latch portions 73 and 83 are inserted into the opening 34. A dashed line shown in FIG. 28 represents the first leg portions 72 and 82 when the spring portions 75 and 85 are not displaced.

Edge portions of the latch portions 73 and 83 contact the side wall of the opening 34, i.e., the wall surface portion 35b, by reactive force or restoring force generated by the elastic deformation of the spring portions 75 and 85. The retaining portion 60 is further pushed into the opening 34 so that the latch portions 73 and 83 are passed through the opening 34. Thereby, at least a part of the latch portions 73 and 83 is disposed at the periphery of the opening 34 on the rear face 31b of the substrate 31 as shown in FIG. 21 and FIG. 22. End surfaces at the substrate side of the latitudinal portions 74b and 84b of the coupling portions 74 and 84 and the parallel portions 75b and 85b of the substantially planar U-shaped spring portions 75 and 85 are laminated on the main face portion 35a, which is disposed on the main face 31a of the substrate 31, through the soldering paste. The mounting portion of each of the terminals 51 is laminated on the land 33 on the main face 31a of the substrate 31, through the soldering paste.

Reflow is performed with the retaining member 60 disposed on the substrate 31 through the soldering paste. Thereby, the molten solder is spread on the main faces of the coupling portions 74 and 84 made of metal materials and the dummy land 35 by the capillary action, which influences between the side wall of the opening 34, i.e., the wall surface portion 35b of the dummy land 35, and each of the longitudinal portions 74a and 84a and between the main face portion 35a and each of the parallel portions 75b, 85b, the latitudinal portions 74b and 84b. Thus, in the present embodiment, the retaining member 60 is connected to the dummy land 35 disposed on the side wall of the opening 34 and the periphery of the opening 34, through the solder 36, as shown in FIG. 24.

The retaining member 60 includes the base portion 61 and the first leg portion 62, which are made of the same metal plate. The retaining member 60 further includes the latch portions 73 and 83, which are passed through the opening 34 and disposed on the rear face 31b of the substrate 31 at the periphery of the opening 34 in the retaining state. Each of the spring portions 75 and 85, which is connected to each of the latch portions 73 and 83 through each of the coupling portions 74 and 84, is displaced. Thereby, the latch portions 73 and 83 are passed through the opening 34 so that the latch portions 73 and 83 are disposed on the rear face 31b of the substrate 31. When external force for pulling the first leg portion 62 out of the opening 34, i.e., external force for pulling the connector 50 out of the substrate 31, is applied, the latch portions 73 and 83 are latched on the rear face 31b of the substrate 31. Therefore, compared to the conventional retaining member, bearing force with respect to tensile force is improved, and hereby, the retaining strength of the connector 50 to the substrate 31 can be increased. That is, the connector 50 can be made difficult to be unlatched from the substrate 31 before the terminal 51 is soldered.

The latch portions 73 and 83 latched on the substrate 31 and the spring portions 75 and 85 are disposed on different positions from each other in the first leg portions 72 and 82, and the spring portions 75 and 85 cannot be inserted into the opening 34. That is, the spring portions 75 and 85 are not latched on the substrate 31 by reactive force generated by the deformation of the spring portions 75 and 85. The spring portions 75 and 85 have spring property that can arrange the latch portions 73 and 83 on the rear face 31b of the substrate 31 when the latch portions 73 and 83 and the coupling portions 74 and 84 are inserted into the opening 34 and the latch portions 73 and 83 are passed through the opening 34. In other words, spring property that the edge portions of the latch portions 73 and 83 strongly contact the side wall of the opening 34 when the latch portions 73 and 83 and the coupling portions 74 and 84 are inserted into the opening 34 is unnecessary. Thereby, inserting force of the latch portions 73 and 83 and the coupling portions 74 and 84 into the opening 34 can be decreased. In contrast to the conventional retaining member, in which the spring portion is latched on the side wall of the opening, damage of the side wall of the opening 34, i.e., the wall surface portion 35b, can be decreased. The spring portions 75 and 85 can be designed freely.

In the present embodiment, the width W of the spring portions 75 and 85 in the latitudinal direction is larger than the thickness T of the metal plate, and the spring portions 75 and 85 are displaced in the thickness direction. The spring portions 75 and 85 extend in substantially the same direction with the coupling portions 74 and 84, and the portions between the coupling end with each of the coupling portions 74 and 84 and the coupling end with the base portion 61 is substantially planar U-shaped before the spring portions 75 and 85 are displaced. The plate thickness direction of the flat plate-like portion is substantially parallel to the direction, in which the latch portions 73 and 83 extend from the coupling portions 74 and 84 before the spring portions 75 and 85 are displaced. In other words, the spring portions 75 and 85 extend toward the main face 31a of the substrate 31 from the base portion 61, and the plate thickness direction of the flat plate-like portion is substantially parallel to the main face 31a of the substrate 31 before the spring portions 75 and 85 are displaced. Thereby, the spring portions 75 and 85 are displaced substantially parallel to the direction, in which the latch portions 73 and 83 extend from the coupling portions 74 and 84, that is, with respect to the substrate 31, on which the connector 50 is mounted by the retaining member 60, the spring portions 75 and 85 are displaced in the direction substantially perpendicular to the up-down direction, i.e., the direction along the main face 31a, not parallel to the up-down direction. Therefore, compared to the structure that the spring portion is displaced in the up-down direction, the positional accuracy of the connector 50 to the substrate 31 in the up-down direction can be increased. The retaining member 60 of the present embodiment is preferable to apply to the electric component, which is required the positional accuracy in the thickness direction of the substrate 31, such as the connector 50 including the terminal 51 having the surface mounting structure. As the terminal 51 having the surface mounting structure, a branch terminal including both a through-hole mounting portion, which is inserted into an opening of a substrate, and a surface mounting portion may be used.

In the present embodiment, the bent positions of the retaining member 60 are the connection portion between the base portion 61 and the spring portion 75, the connection portion between the base portion 61 and the spring portion 85, the connection portion between the spring portion 75 and the coupling portion 74, and the connection portion between the spring portion 85 and the coupling portion 84. The retaining member 60 is not bent in the thickness direction of the substrate 31 at each of the bent positions. Therefore, the structure of the retaining member 60 can be simplified by decreasing the bent positions, and the positional accuracy of the connector 50 to the substrate 31 in the thickness direction of the substrate 31 can be increased. Since the retaining member 60 is not bent in the thickness direction of the substrate 31, bearing force with respect to stress in the up-down direction, i.e., force for pulling the retaining member 60 from the opening 34, for example, can be improved.

In the present embodiment, the latch portions 73 and 83 and the coupling portions 74 and 84 are formed integrally to have a flat plate-like shape, and the latch portions 73 and 83 are formed by only the die cutting. Therefore, compared to the structure that the latch portions 73 and 83 are formed by the bending process, the structure which including the connection portions between the coupling portion 74 and the latch portion 73 and between the coupling portion 84 and the latch portion 83 as the bending positions, bearing force of the latch portions 73 and 83 to the deformation and the damage can be improved, and hereby, the retaining strength of the connector 50 to the substrate 31 can be increased.

In the present embodiment, the retaining portion 60 includes the pair of first leg portions 72 and 82 extended in the same direction from the base portion 61. The first leg portion 72 opposes to the first leg portion 82. The extending direction of the latch portion 73 in the first leg portion 72 from the coupling portion 74 is opposite to the extending direction of the latch portion 83 in the first leg portion 82 from the coupling portion 84. As described above, in case that multiple first leg portions 72 and 82 are extended from one base portion 61, the retaining strength of the connector 50 to the substrate 31 can be increased compared to the case that only one first leg portion is extended from a base portion. Since the extending direction of the latch portion 73 is opposite to the extending direction of the latch portion 83, unsteadiness to the substrate 31 can be suppressed. Thereby, the latch portions 73 and 83 can be made difficult to be unlatched from the rear face 31b of the substrate 31. Since the extending direction of the latch portion 73 is opposite to the extending direction of the latch portion 83, unsteadiness to the substrate 31 can be suppressed effectively. Furthermore, since the latch portions 73 and 83 extend in the front-rear direction, the retaining member 60 can be displaced easier in the lateral direction, i.e., the longitudinal direction of the housing 52 in the connector 50, than in the front-rear direction. Therefore, when stress based on a difference of linear expansion coefficient between the housing 52 and the substrate 31 by the temperature change in mounting the terminal 51 by reflow is generated, since the clearance in the lateral direction is larger than the clearance in the front-rear direction, stress applied to a junction between the terminal 51 and the corresponding land 33 and stress applied to the retaining member 60 can be suppressed.

In the present embodiment, in the plate thickness direction of the base portion 61, the position of the latch portion 73 is same with the position of the latch portion 83 at least before the spring portions 75 and 85 are displaced. In other words, the flat plate portion in the spring portion 75 is substantially planar U-shaped, and the lengths of the parallel portions 75a and 75b are substantially same. Similarly, the flat plate portion in the spring portion 85 is substantially planar U-shaped, and the lengths of the parallel portions 85a and 85b are substantially same. That is, in the first leg portions 72 and 82, portions other than the latch portions 73 and 83 have the symmetry structures with each other. Therefore, the structures of the first leg portions 72 and 82 are simplified, and the first leg portions 72 and 82 can be formed with high accuracy. Moreover, the connection portion between the base portion 61 and the spring portion 75 and the connection portion between the spring portion 75 and the coupling portion 74 can be bent at the same time. Similarly, the connection portion between the base portion 61 and the spring portion 85 and the connection portion between the spring portion 85 and the coupling portion 84 can be bent at the same time. Therefore, the bending processes can be decreased.

In the present embodiment, the opening 34, in which the first leg portions 72 and 82 of the retaining member 60 are inserted, has the long hole shape with extended in one direction. The latch portion 73 of the first leg portion 72 is extended from the coupling portion 74 in the longitudinal direction of the opening 34, and the latch portion 83 of the first leg portion 82 is extended from the coupling portion 84 in the longitudinal direction of the opening 34. The extended direction of the latch portion 73 is opposite to the extended direction of the latch portion 83. The latch portions 73 and 83 are disposed at the periphery of the opening 34 in the longitudinal side on the rear face 31b of the substrate 31. In this manner, the opening 34 is formed to have the long hole shape, the coupling portions 74 and 84 can be twisted widely when the first leg portions 72 and 82 are inserted into the opening 34 compared to a circular opening having the same cross section with the opening 34. That is, reactive force of the spring portions 75 and 85 becomes small, and inserting force of the latch portions 73 and 83 and the coupling portions 74 and 84 to the opening 34 can be decreased. Therefore, when the latch portions 73 and 83 and the coupling portions 74 and 84 are inserted into the opening 34, the damage of the side wall of the opening 34 can be decreased. The longitudinal direction of the opening 34 is substantially parallel to the latitudinal direction, i.e., the front-rear direction, of the housing 52 of the connector 50. Therefore, the arrangement space of wiring on the substrate 31 can be easily set.

In the present embodiment, at the end portion 52b of the housing 52 in the longitudinal direction, the retaining member 60 is disposed such that the plate thickness direction of the base portion 61 is substantially parallel to the longitudinal direction of the housing 52. With respect to the base portion 61, the spring portions 75 and 85 are bent to the outside of the nearer end portion 52b in the housing 52. In other word, the direction, in which the spring portions 75 and 85 are bent, is outside the housing 52 in the longitudinal direction. By using the mounting portion of the land 33 at the terminal 51 as a standard in the up-down direction, the spring portions 75 and 85, which are nearer to the mounting portion than the base portion 61, are disposed at the outside of the base portion 61 in the longitudinal direction of the housing 52, i.e., the lateral direction. Therefore, considering the draft angle from the mold of the housing 52, which is formed by injection molding of resin, the dimension of the connector 50 in the longitudinal direction of the housing 52, i.e., the lateral direction, can be reduced.

In the present embodiment, the dummy land 35 is formed at the periphery of the opening 34 in the substrate 31, and that the first leg portions 72 and 82 are connected to the dummy land 35 through the solder 36. However, the first leg portion 72 and 82 may not be connected to the dummy land 35. For example, the opposing portion 73a of the latch portion 73 has the tapered shape, and the end surface of the latitudinal portion 74b of the coupling portion 74 of the substrate side is flat and smooth so that the end surface is substantially parallel to the main face 31a of the substrate 31. Therefore, the substrate 31 is interposed between the latch portion 73 and the coupling portion 74 and between the latch portion 83 and the coupling portion 84. Thereby, unsteadiness of the connector 50 to the substrate 31 can be suppressed and the retaining strength of the connector 50 to the substrate 31 can be increased.

In the present embodiment, the connection portion between the base portion 61 and the spring portion 75 and the connection portion between the spring portion 75 and the coupling portion 74 are bent substantially 90 degrees in the same direction. Similarly, the connection portion between the base portion 61 and the spring portion 85 and the connection portion between the spring portion 85 and the coupling portion 84 are bent substantially 90 degrees in the same direction. However, the bent angle at each of the connection portions may be an angle other than 90 degrees. For example, both connection portions may be bent in the opposite direction each other, and the bent angle may be an angle other than 90 degrees. When the connection portion between the base portion 61 and the spring portion 75 and the connection portion between the spring portion 75 and the coupling portion 74 are bent substantially the same angle in the same direction, the both connection portions can be bent at the same time.

Figure 29A:
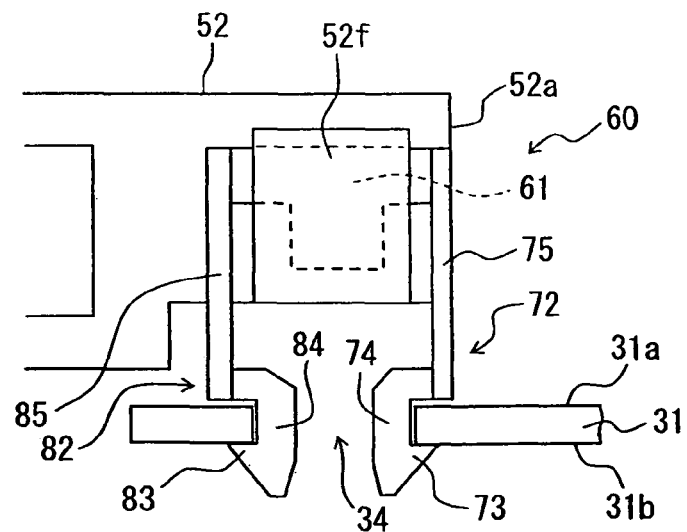
FIG. 29A is a plan view seen from outside in the lateral direction showing a modification of a retaining structure of the retaining member with respect to the connector.
Figure 29B:
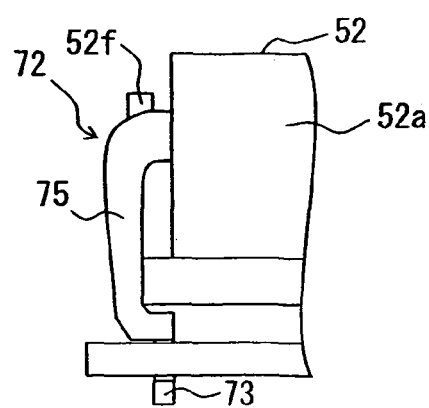
FIG. 29B is a plan view seen from a front face of a housing in a front-rear direction showing a modification of a retaining structure of the retaining member with respect to the connector.

In the present embodiment, the groove portion 52c, which opens on the front face 52a, is formed in the housing 52 of the connector 50. The retaining member 60 of the connector 50 is fixed by inserting the base portion 61 of the retaining member 60 into the groove portion 52c from the front face 52a side of the housing 52. However, the retaining structure of the retaining member 60 may be an arbitrary structure. For example, as shown in FIG. 29A and FIG. 29B, a fixing portion 52f having a longitudinal slit-like groove is formed on the end portion 52b of the housing 52 in the lateral direction, the base portion 61 of the retaining member 60 is inserted into the groove of the fixing portion 52f from above and fixed to the groove.

Figure 30A:
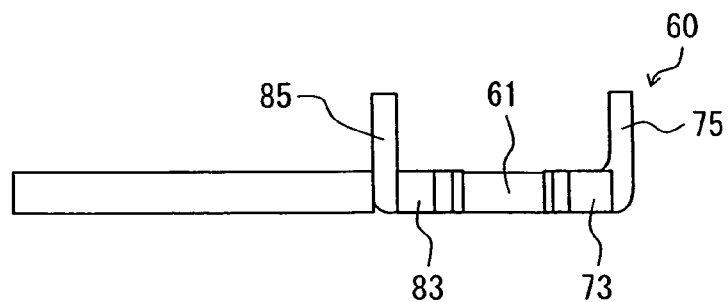
FIG. 30A is a plan view showing the retaining member of the seventh embodiment seen from a latch portion side.
Figure 30B:
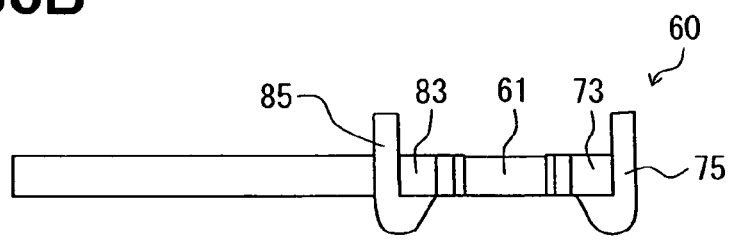
FIG. 30B is a plan view showing a modified retaining member seen from a latch portion side.

As shown in FIG. 30A, the present embodiment shows an example that the spring portions 75 and 85 project on one surface to the base portion 61 in the plate thickness direction of the base portion 61. However, as shown in FIG. 30B, a structure that the spring portions 75 and 85 project on both surfaces in the plate thickness of the base portion 61. Thereby, in case that the lengths of the spring portions 75 and 85 are same, dimensions of the retaining member 60 in the plate thickness direction of the base portion 61, i.e., in the lateral direction, can be reduced.

Figure 31A:
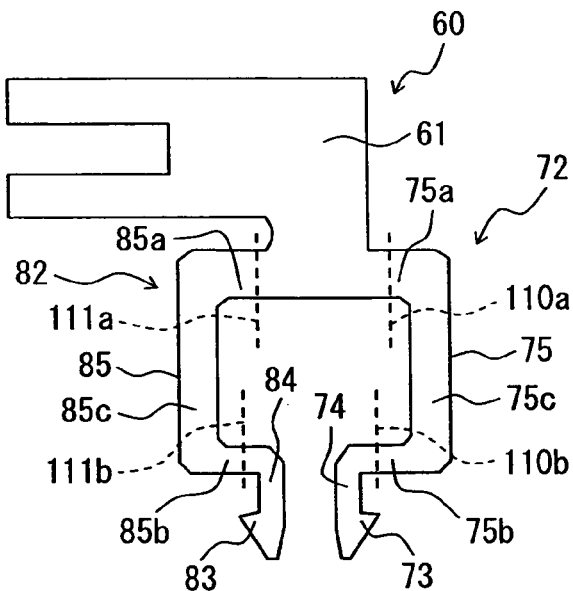
FIG. 31A is an extended view showing a modified spring portion.
Figure 31B:
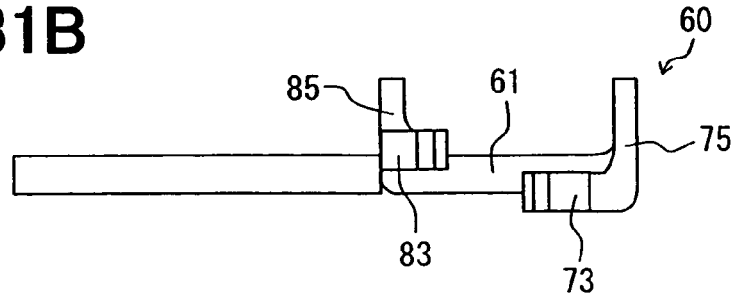
FIG. 31B is a plan view seen from the latch portion side showing a modified spring portion.

As shown in FIG. 25, the present embodiment shows that the latch portions 73 and 83 and the coupling portions 74 and 84 are formed integrally to have a flat plate-like shape, and the flat plate-shape portions are same positions in the plate thickness of the base portion 61. In other wards, the bent position of the spring portion 75 to the base portion 61 and the bent position of the spring portion 75 to the coupling portion 74 are in line shown by a broken line 108 in FIG. 25, and the bent position of the spring portion 85 to the base portion 61 and the bent position of the spring portion 85 to the coupling portion 84 are in line shown by a broken line 109 in FIG. 25. However, as shown in FIG. 31A and FIG. 31B, the latch portion 73 is distant from the latch portion 83 with a margin more than the plate thickness in the plate thickness direction of the base portion 61 at least before the spring portions 75 and 85 are displaced. In such a structure, as shown in FIG. 31A, a bent position 110a of the spring portion 75 to the base portion 61 is not in line with a bent position 110b of the spring portion 75 to the coupling portion 74, and a bent position 111a of the spring portion 85 to the base portion 61 is not in line with a bent position 111b of the spring portion 85 to the coupling portion 84. As shown in FIG. 31B, the latch portion 73 is distant from the latch portion 83 with a margin more than the plate thickness in the plate thickness direction of the base portion 61 at least before the spring portions 75 and 85 are displaced. Thus, when the first leg portions 72 and 82 are inserted into the opening 34, contact of the latch portion 73 with the latch portion 83 and contact of the coupling portion 74 with the coupling portion 84 can be prevented. In FIG. 31A and FIG. 31B, the lengths of the spring portions 75 and 85 are substantially same.

Eighth Embodiment

Next, an eighth embodiment of the present invention will be described with reference to FIG. 32 to FIG. 35.

Figure 32:
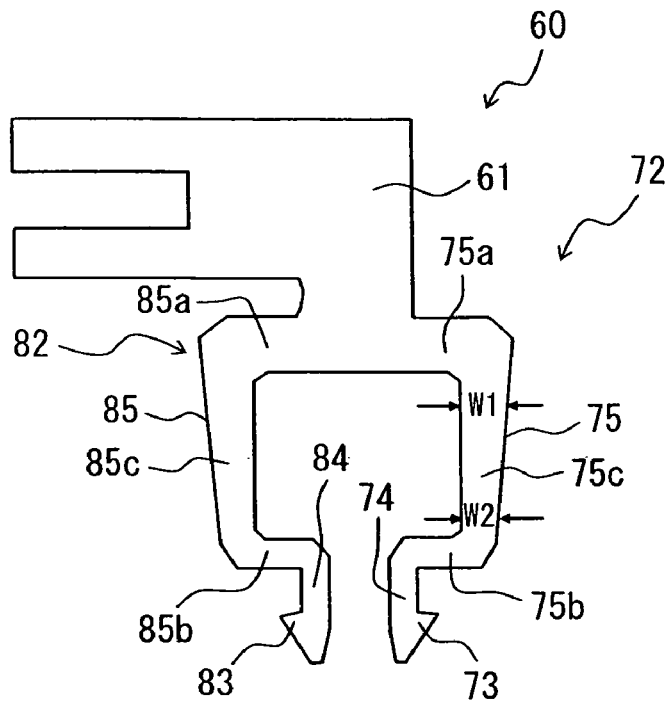
FIG. 32 is an extended view of a retaining member according to an eighth embodiment.

The seventh embodiment shows the example that the width W of the flat plate-like portion of the spring portions 75 and 85 in the latitudinal direction is constant in the longitudinal direction and that the flat plate-like portion is substantially planar U-shaped. However, the shape of the spring portions 75 and 85 may be a different form. For example, as shown in FIG. 32, although the spring portions 75 and 85 are substantially planar U-shaped and the width W is larger than the plate thickness T, the width W of the latitudinal direction of the flat plate-like portion is not constant in the longitudinal direction. The width W becomes wider toward the connection portions with the base portion 61, and the width W becomes narrower toward the connection portions with each of the coupling portions 74 and 84. Referring to FIG. 32, a width W1 of the spring portion 75 at the near side of the base portion 61 is wider than a width W2 of the spring portion 75 at the near side of the coupling portion 74.

When the latch portions 73 and 83 are inserted into the opening 34 of the substrate 31, stress applied on the spring portions 75 and 85 increases toward a position far from the latch portions 73 and 83, that is, toward the connection portion with the base portion 61. In contrast, according to the present embodiment, since rigidity becomes higher toward the near side of the connection portion with the base portion 61, stress is dispersed by the spring portions 75 and 85 so that stress concentration at the connection portion side with the base portion 61 of the spring portions 75 and 85 can be suppressed.

Figure 33:
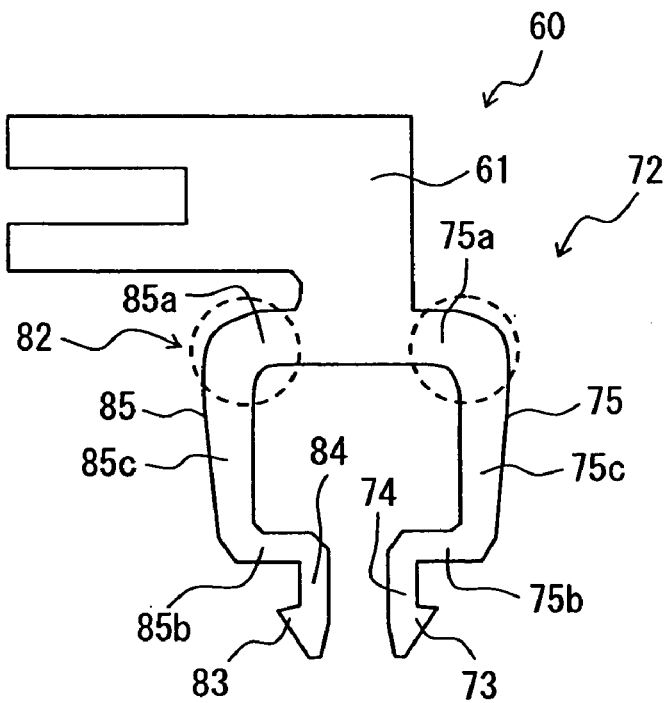
FIG. 33 is an extended view showing a modified spring portion.
Figure 34:
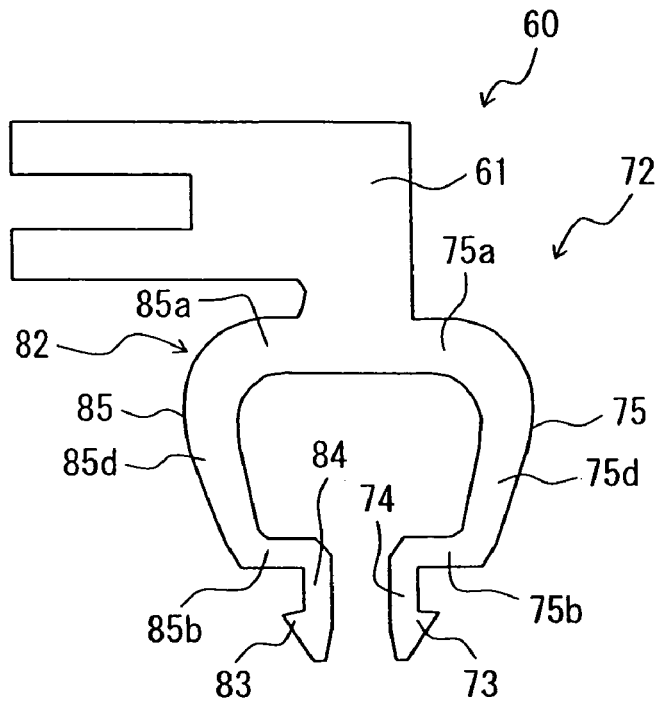
FIG. 34 is an extended view showing a modified spring portion.
Figure 35:
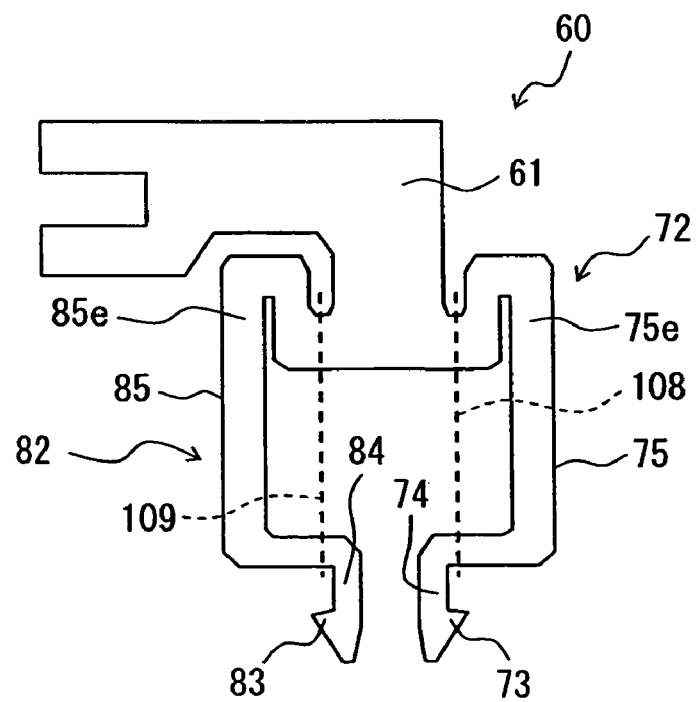
FIG. 35 is an extended view showing a modified spring portion.

Other than the example of FIG. 32, the spring portions 75 and 85 shown in FIG. 33 to FIG. 35 can be applied. In the example shown in FIG. 33, the outline, i.e., the portion circled with a broken line, of the spring portions 75 and 85 from the connection portions of the parallel portions 75a and 85a with the base portion 61 to the connection portions of the parallel portions 75a and 85a with the straight portions 75c and 85c has a rounded shape. In contrast to an angular-shaped, i.e., an angle below 90 degrees, stress concentration at the connection portions with the base portion 61 can be suppressed. An outline of a polygonal shape formed by connecting multiple angles more than 90 degrees may be used.

In the example shown in FIG. 34, a coupling portion 75d between the parallel portions 75a and 75b and a coupling portion 85d between the parallel portions 85a and 85b, which correspond to the straight portions 75c and 85c, are twisted with respect to the up-down direction to couple the parallel portions 75a and 75b, and the parallel portions 85a and 85b, respectively. In the example shown in FIG. 35, the spring portions 75 and 85 includes folding portions 75e and 85e, in which end surfaces thereof are adjacent to each other. In the structures of FIG. 34 and FIG. 35, even if the heights of the spring portions 75 and 85 are same in the up-down direction, spring force can be weakened by lengthening the spring length compared to the substantially U-shaped spring portions. Since the amount of displacement, i.e., the stroke, of the spring portions 75 and 85 increases when applied force is same, lengths of the latch portions 73 and 83 can be lengthened. That is, it is difficult for the latch portions 73 and 83 to be unlatched, and pulling out of the first leg portions 72 and 82 from the opening 34 can be suppressed.

Ninth Embodiment

Figure 36:
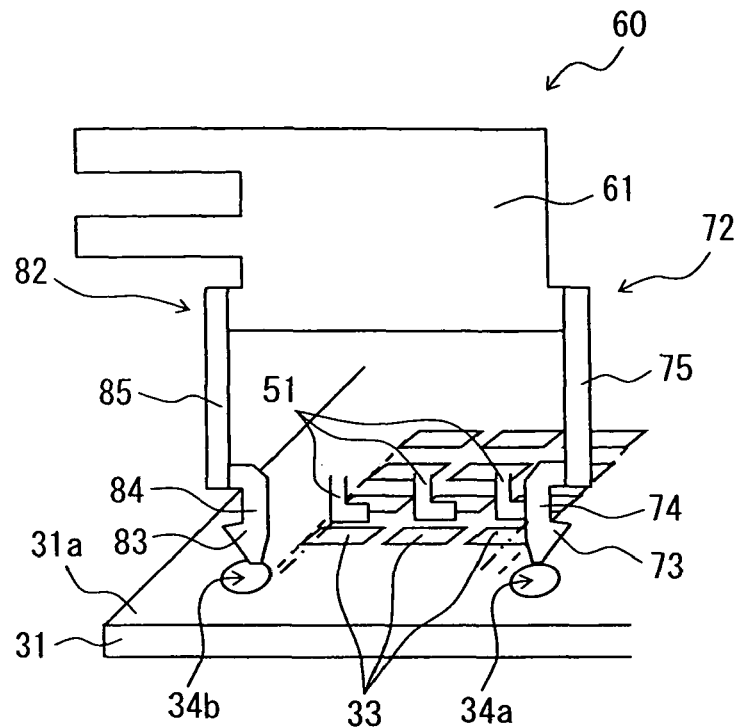
FIG. 36 is a perspective view showing a positional relation between the latch portion and a land in an electric control device according to a ninth embodiment.

Next, a ninth embodiment of the present invention will be described with reference to FIG. 36.

In the present embodiment, the lands 33 are disposed to have multiple stages, three stages in the present embodiment, for example, also in the front-rear direction not only in the lateral direction, and all the lands 33 are disposed between the latch portions 73 and 83 in the front-rear direction. Specifically, as shown by a dashed line in FIG. 36, the distance between the edge portion of the latch portion 73 and the edge portion of the latch portion 83 is larger than the distance between a back end of a first stage of the land 33 at a near side of the first leg portion 82 and a front end of a third stage of the land 33 at a near side of the first leg portion 72 in the front-rear direction. In other words, the mounting portions of the terminals 51 correspond to the lands 33 to be disposed to have multiple stages, three stages in the present embodiment, for example, also in the front-rear direction not only in the lateral direction. All the multiple-stage mounting portions are disposed between the latch portion 73 and the latch portion 83. Specifically, as shown by a dashed-dotted line in FIG. 36, the distance between the edge portion of the latch portion 73 and the edge portion of the latch portion 83 is larger than the distance between a back end of the mounting portion of a first stage of the terminal 51 at a near side of the first leg portion 82 and a front end of the mounting portion of a third stage of the terminal 51 at a near side of the first leg portion 72 in the front-rear direction.

In case that the connector 50 is retained on the substrate 31 by the retaining member 60, external stress that tilts the connector 50 in the front-rear direction is applied to the first leg portions 72 and 82, which are disposed on an outer side of the mounting portions of the terminals 51 in the front-rear direction, before external stress is applied to the connector 50, i.e., the housing 52. Therefore, reliability of the connection at the connecting portions of the terminals 51 and the corresponding lands 33 can be increased.

In case that unsteadiness is generated at the first leg portions 72 and 82 to the substrate 31 in the up-down direction due to at least one of the dimensions of the first leg portions 72 and 82 and the thickness of the substrate 31, the larger the distance between the latch portions 73 and 83, the smaller the tilt of the connector 50 to the substrate 31. In the above-described structure, all the multiple-stage lands 33, that is, all the multiple-stage mounting portions are disposed between the latch portions 73 and 83 in the front-rear direction. Thereby, the distance between the latch portions 73 and 83 is ensured. Therefore, the tilt of the connector 50 can be decreased compared to the structure that the lands 33 and the mounting portions of the terminals 51 are disposed at the outside of the space between the latch portions 73 and 83 in the front-rear direction.

In the present embodiment, each of the first leg portions 72 and 82 is inserted into each of openings 34a and 34b, which is disposed in different portions on the substrate 31. Thereby, unsteadiness of the connector 50 to the substrate 31 can be suppressed compared to the structure that the first leg portions 72 and 82 are inserted into the one opening 34 because the looseness of the first leg portions 72 and 82 to the opening 34 is small. It becomes difficult for the latch portions 73 and 83 in the retaining state to be unlatched. The structure that each of the first leg portions 72 and 82 is inserted into each of the openings 34a and 34b of the substrate 31 may be applied to the above-described embodiments. The structure that the first leg portions 72 and 82 are inserted into the one opening 34 may be applied to the present embodiment. In this regard, since the length of the opening 34 in the front-rear direction increases, it becomes easy for the latch portions 73 and 83 to be released from the rear face 31b of the substrate 31.

Tenth Embodiment

Next, a tenth embodiment of the present invention will be described with reference to FIG. 37 to FIG. 38B.

Figure 37:
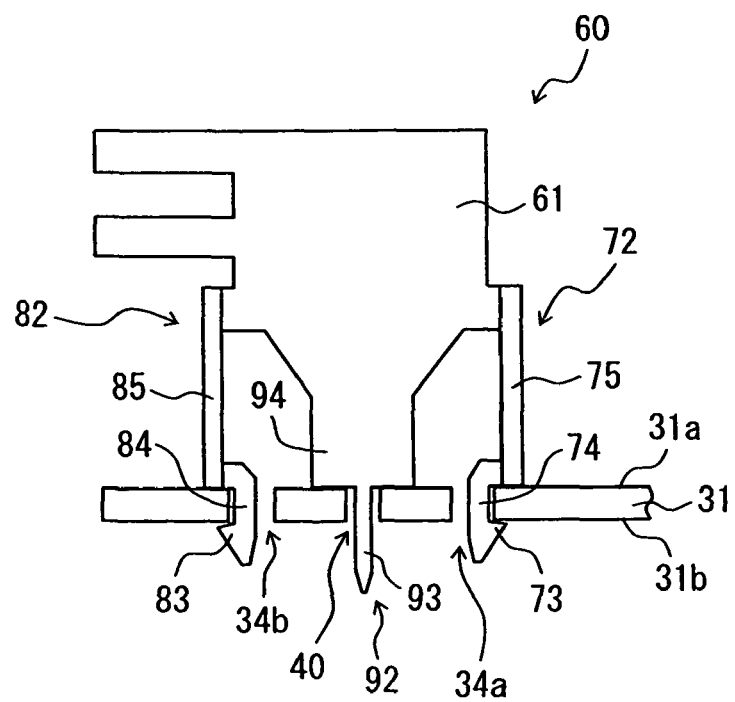
FIG. 37 is a plan view showing a retaining member according to a tenth embodiment when the retaining member is attached to a substrate.

As shown in FIG. 37, the retaining member 60 further includes a second leg portion 92 that extends in the same direction with the first leg portions 72 and 82 from the base portion 61. The second leg portion 92 is disposed between the first leg portions 72 and 82, and inserted into a different opening 40 from the openings, in which the first leg portions 72 and 82 are inserted. The second leg portion 92, the first leg portions 72 and 82 and the base portion 61 are formed integrally by processing the same metal plate so that the second leg portion 92 having a flat plate portion is obtained. The width in the latitudinal direction of the metal plate is larger than the thickness T of the metal plate. The second leg portion 92 is extended from the base portion 61, and an end portion of the second leg portion 92 is inserted into the opening 40. The plate thickness direction at the flat plate-like portion is substantially parallel to the plate thickness direction at the base portion 61. It is difficult for the second leg portion 92 to be deformed in the plate thickness direction of the spring portions 75 and 85, that is, the displacement direction of the spring portions 75 and 85. Therefore, when external stress is applied to the plate thickness direction of the spring portions 75 and 85, i.e., in the front-rear direction, unsteadiness of the retaining member 60 can be suppressed by the second leg portion 92 inserted into the opening 40, which differs from the openings 34a and 34b. It is noted that the latitudinal direction of the second leg portion 92 is a direction substantially perpendicular to the extending direction from the base portion 61, i.e., the longitudinal direction, in the plane substantially perpendicular to the plate thickness of the flat plate-like portion.

As shown in FIG. 37, the end portion of the flat plate-like portion of the second leg portion 92 is disposed farther from the base portion 61 than the end portions of the latch portions 73 and 83. Thus, the second leg portion 92 can be inserted into the opening 40 before the first leg portions 72 and 82 are inserted into the opening 34a and 34b. Therefore, each of the first leg portions 72 and 82 can be inserted easily into each of the openings 34a and 34b by the positioning of the second leg portion 92.

As shown in FIG. 37, the flat plate-like portion of the second leg portion 92 includes an inserting portion 93 and a retaining portion 94. The inserting portion 93 corresponds to a portion from an end portion of the second leg portion 92 to a predetermined portion. At least a part of the inserting portion 93 is inserted into the opening 40. The retaining portion 94 connects to the inserting portion 93 and the base portion 61, and a width of the retaining portion 94 is larger than that of the inserting portion 93. The end surface of the retaining portion 94 at the inserting portion 93 side substantially corresponds to opposing surfaces in the latitudinal portions 74b and 84b of the coupling portions 74 and 84 with the main face 31a of the substrate 31. When the inserting portion 93 is inserted into the opening 40 and the latch portions 73 and 83 are disposed at the periphery of the openings 34a and 34b on the rear face 31b of the substrate 31, the end surface of the retaining portion 94 at the inserting portion 93 side can be in contact with the main face 31a of the substrate 31. Therefore, unsteadiness to the substrate 31 can be decreased.

A part of the second leg portion 92 is attached to the dummy land disposed at the periphery of the opening 40 by the solder so that the retaining strength of the connector 50 to the substrate 31 can be increased. In an example shown in FIG. 38A, the retaining strength of the connector 50 to the substrate 31 is further increased by attaching the end surface of the retaining portion 94 to the corresponding dummy land 38 disposed on the main face 31a of the substrate 31. Specifically, the structure of the dummy land 38 is similar to that of the dummy land 35, and the soldering paste 36a is applied on only the main face 31a of the substrate 31 in the dummy land 38. The soldering paste 36a is disposed on only the main face of the dummy land 38 and a portion, which is far from the opening 40. Thus, contamination of the reflow furnace by the soldering paste 36a can be suppressed as well as the above-described dummy land 35. Reflow mounting can be performed to the dummy land 38 corresponding to the second leg portion 92. Therefore, the second leg portion 92, the first leg portions 72 and 82, the terminal 51 and the other electric components can be solder-mounted simultaneously.

Figure 38A:
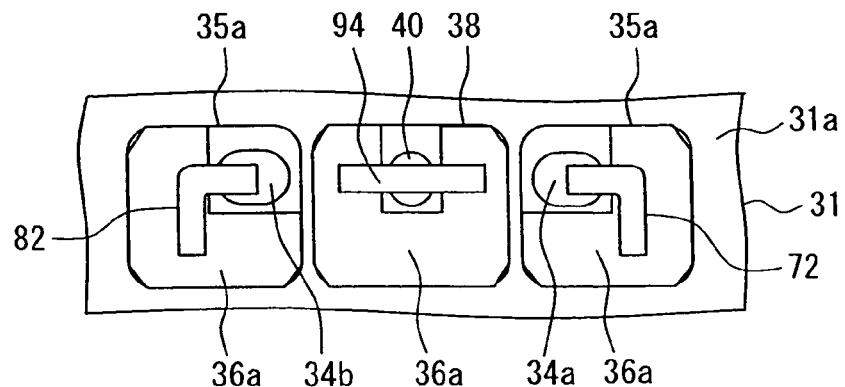
FIG. 38A is a plan view showing a positional relation between a leg portion and solder applied on a dummy land.
Figure 38B:
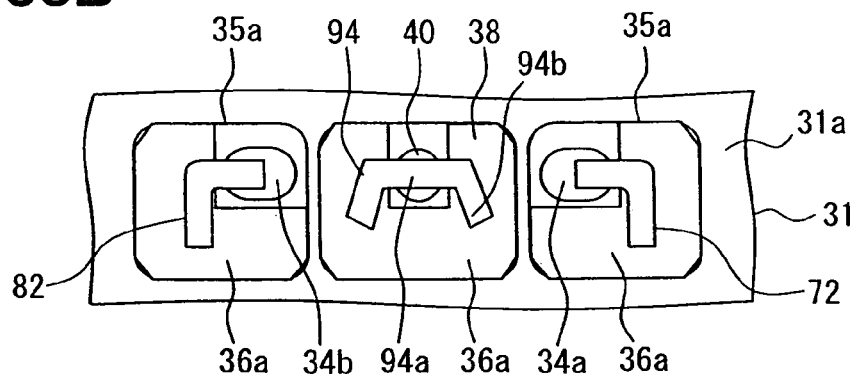
FIG. 38B is a plan view showing a positional relation between a leg portion and solder applied on a dummy land.

In contrast to the FIG. 38A, the retaining portion 94 shown in FIG. 38B is a substantially planar tub-shaped or a substantially planar U-shaped. The retaining portion 94 includes a planar-like portion 94a, which is formed with the inserting portion 93 integrally, and a bent portion 94b, which is bent toward the portion 94a, in the front-rear direction. Thereby, the contact area between the soldering paste 36a and the retaining portion 94 can be increased.

The contact area between each of the first leg portions 72 and 82 and the soldering paste 36a and the contact area between the second leg portion 92 and the soldering paste 36a are ensured, and the openings 34 and 40 are disposed at end portions of the dummy lands 35 and 38 so as to decrease areas of the dummy lands 35 and 38. Reference numeral 35a denotes the main face portion of the dummy land 35. Other than the above-described position of the openings 34 and 40, the openings 34 and 40 may be disposed at the center of the dummy lands 35 and 38. In FIG. 38A and FIG. 38B, although the opening 40 is disposed on a straight line, with which the opening 34a and the opening 34b are connected, one long hole structured by the openings 34a and 34b may be used by displacing the opening 40.

Eleventh Embodiment

Next, an eleventh embodiment of the present invention will be described with reference to FIG. 39 to FIG. 40B.

Figure 40A:
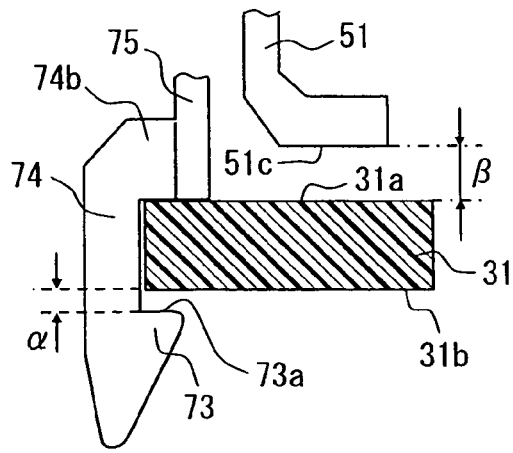
FIG. 40A is a partially cross sectional view showing the effect of a comparative example connector of FIG. 39.

As shown in the above-described embodiments, when the terminal having the surface mounting structure is used as the terminal 51 and a part of the coupling portions 74 and 84, i.e., the latitudinal portions 74b and 84b is disposed on the main face 31a of the substrate 31, it is preferable that the opposing surfaces of a part of the coupling portions 74 and 84 to the main face 31a of the substrate 31 substantially correspond to the bottom surfaces of the surface mounting portions of the terminals 51 in the up-down direction. However, positions of the surface mounting portions of multiple terminals 51 having the surface mounting structure are varied to some extent in the up-down direction because of production variation and assembly variation. That is, positions of the surface mounting portions are varied in the range of tolerance. In addition, clearances between the latch portions 73 and 83 of the first leg portions 72 and 82 with the connector 50 attached to the substrate 31 by the retaining portion 60 are varied to some extent. That is, positions of the latch portions 73 and 83 to the rear face 31b of the substrate 31 in the range of tolerance. The positions of the surface mounting portions of the terminals 51 and the positions of the latch portions 73 and 83 are varied so that unsteadiness is generated at the connector 50 to the substrate 31. Assuming that the main face 31a of the substrate 31, that is, the contacting portions with the main face 31a of the substrate 31, i.e., the latitudinal portions 74b and 84b of the coupling portions 74 and 84 as a reference position, clearances between each of the latch portions 73 and 83 and the rear face 31b of the substrate 31 may be varied in the range of tolerance $\alpha$, as shown in FIG. 40A. The position of a bottom surface 51c in the surface mounting portion of the terminal 51 is varied in the range of tolerance $\beta$ upwardly from the reference position, as shown in FIG. 40A. In this case, the width of unsteadiness of the connector 50 to the substrate 31 becomes $\alpha+\beta$. Therefore, the surface mounting portion of the terminal 51 may not be connected to the corresponding land 33 through the solder 36.

In the present embodiment, the width of unsteadiness of the connector 50 to the substrate 31 is decreased by using spring property of the terminal 51. As shown in FIG. 39, the bottom surface 51c of the surface mounting portion of the terminal 51 having the surface mounting structure is located nearer to the latch portions 73 and 83 than the end portions of the latitudinal portions 74b and 84b, which are located on the main face 31a of the substrate 31, in the up-down direction. The distances between each of the end portions of the latitudinal portions 74b and 84b of the coupling portions 74 and 84 and the bottom portions 51c of the terminal 51 are set in a range that the terminal 51 can be deformable by the own spring property within the elastic deformation range.

Figure 39:
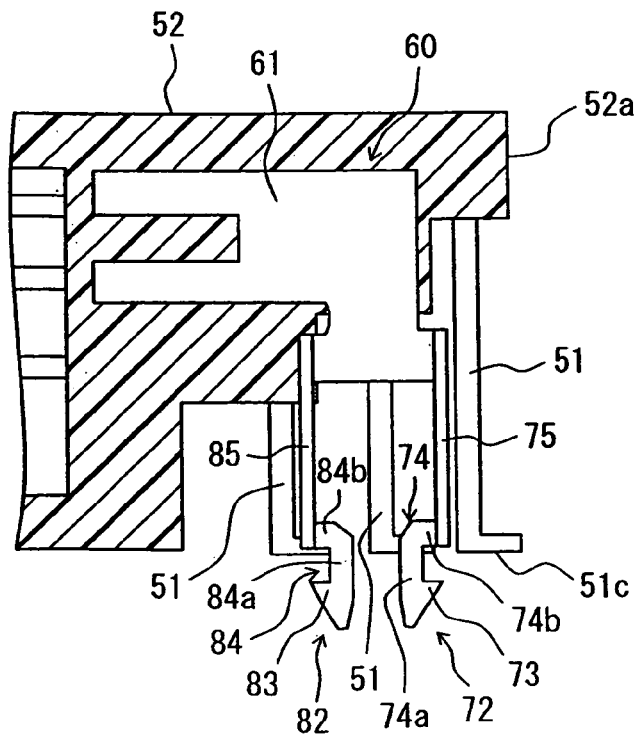
FIG. 39 is a partially cross sectional view showing a connector according to an eleventh embodiment.
Figure 40B:
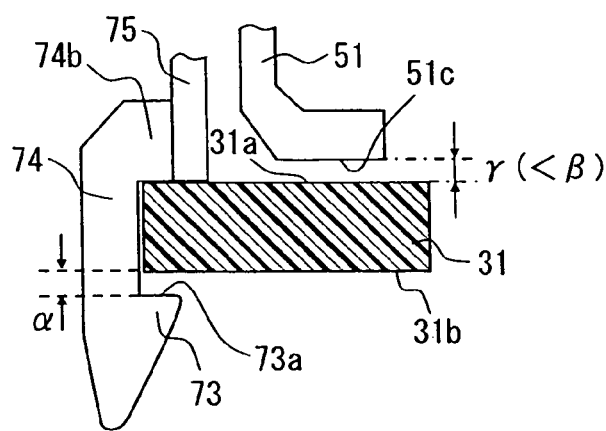
FIG. 40B is a partially cross sectional view showing the effect of the connector of FIG. 39.

Therefore, when the connector 50 shown in FIG. 39 is attached to the substrate 31, the terminal 51 is deformed by the own spring property and the connector 50 can be closer to the substrate 31. Thereby, as shown in FIG. 40B, the variation $\gamma$ of the bottom portion 51c of the substrate 51 with the main face 31a as the reference becomes smaller than the tolerance $\beta$, and the width of unsteadiness of the connector 50 to the substrate 31 becomes $\alpha+\gamma$. Therefore, unsteadiness of the connector 50 to the substrate 31 can be suppressed in the up-down direction, and thereby, reliability of the connection of the terminal 51 and the land 33 can be increased.

Figure 41:
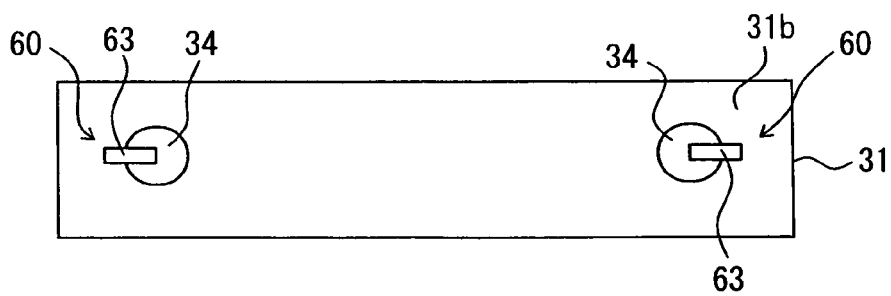
FIG. 41 is a plan view showing a modified retaining member.

In the above-described embodiments, the retaining member 60 having the pair of first leg portions 72 and 82 and the retaining member 60 having the pair of first leg portions 72 and 82 and the second leg portion 92 are shown. However, the number of the leg portions is not limited to that in the above-described embodiments. For example, each of the retaining members 60 disposed at the both ends of the housing 52 in the lateral direction may have only one first leg portion. For example, as shown in FIG. 41, the extending directions of the latch portions 63 are opposite to each other. In FIG. 41, the latch portion 63 of the retaining member 60 on the right side faces rightward and the latch portion 63 of the retaining member 60 on the left side faces leftward. Thereby, unsteadiness in the extending direction of the latch portions 63 can be suppressed, and the latch portion 63 can be made difficult to be unlatched from the rear face 31b of the substrate 31.

The connector 50 may include different types of the retaining members 60. For example, the retaining member 60 having the pair of first leg portions 72 and 82 and the retaining member 60 having the pair of first leg portions 72 and 82 and the second leg portion 92 may be disposed in one connector 50.

The latch portions 73 and 83 may be extended in the lateral direction. The pair of latch portions 73 and 83 may be extended in the different directions other than the opposite directions, or may be extended in the same direction. In addition, the pair of latch portions 73 and 83 may be extended in the opposite directions and inwardly in the lateral direction. However, when the pair of latch portions 73 and 83 are extended at least in the different directions, more preferably, in the opposite directions each other, unsteadiness of the connector 50 to the substrate 31 can be suppressed compared to the structure that the pair of latch portions 73 and 83 are extended in the same direction. Thereby, the latch portions 73 and 83 can be made difficult to be unlatched from the rear face 31b of the substrate 31.

Figure 42:
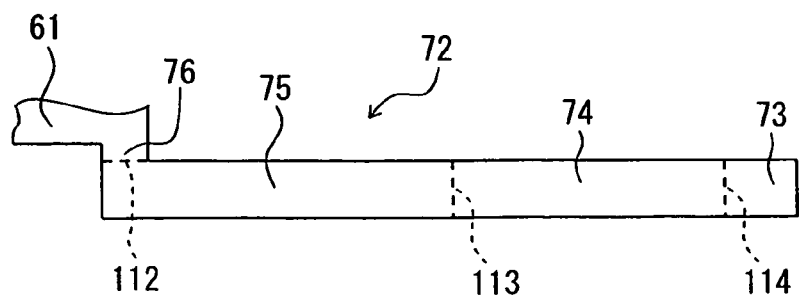
FIG. 42 is an extended view showing a modified retaining member.

In the above-described embodiments, the latch portions 73 and 83 are formed by only the die cutting of the metal plate. However, the retaining member 60 can also be obtained as follows. For example, as shown in FIG. 42, the retaining member 60 can be obtained by bending substantially 90 degrees at a boundary 112 between the bonding portion 76 and the spring portion 75, at a boundary 113 between the spring portion 75 and the coupling portion 74 and at a boundary 114 between the coupling portion 74 and the latch portion 73. However, bearing force with respect to the deformation and the damage decreases by the bending process. Therefore, more preferably, the latch portions 73 and 83 are formed by only the die cutting, that is, the latch portions 73 and 83 and the coupling portions 74 and 84 are formed integrally to have a flat plate shape.

In the above-described embodiments, the electric control device having the non-waterproof structure is used as the electric device. However, an electric control device having a water-proof structure may be used. The electric device is not limited to the electric control device.

In the above-described embodiments, the connector 50 is used as the electric component. However, other than the connector 50 retained on the main face 31a of the substrate 31, the other electric components may be used. A conductive electric component having a terminal being electrically connected to a land of a substrate and a main body, on which the terminal is disposed, may be used.

In the above-described embodiments, the retaining member 60 is inserted from the upper portion into each of the groove portions 54 located on both sides of the housing 52. However, the retaining member 60 may be inserted from a front portion or a rear portion.

In the above-described embodiments, the coupling portions 74 and 84 and the parallel portions 75a and 75b of the spring portions 75 and 85 are connected to the dummy land 35 through the solder 36. However, only the coupling portions 74 and 84 may be connected to the dummy land 35 through the solder 36, that is, the spring portions 75 and 85 are not soldered. In addition, the latch portions 73 and 83 may be connected to the rear face portion 35c of the dummy land 35 through the solder 36.

The dummy land 35 may include only the main face portion 35a. The dummy land 35 may include only the rear face portion 35c. The dummy land 35 may include only the main face portion 35a and the wall surface portion 35b. Alternatively, the dummy land 35 may not be used, or the first leg portions 72 and 82 may not be soldered while the dummy land 35 is used.

In the above-described embodiments, the soldering paste 36a is applied on only the portion far from the opening 34 or the opening 40 on the main face portion 35a of the dummy land 35 or on the dummy land 38. However, the soldering paste 36a may be applied in the openings 34 and 40. In such a case, the contact area of the solder 36 with the first leg portions 72 and 82 and the second leg portion 92 increases. Thereby, the connector 50 can be retained firmly on the substrate 31.

In the above-described embodiments, the retaining members 60 are arranged at the periphery of both end portions 52b and two portions between the both end portions 52b in the lateral direction, or the retaining members 60 are arranged at the periphery of both end portions 52b. However, multiple retaining members 60 may be arranged at a region between the both end portions 52b. Thereby, warpage of the substrate 31 to the connector 50 can be suppressed and reliability of the connection of the terminal 51 to the land 33 can be increased.

In the above-described embodiments, the retaining member 60 includes only one second leg portion 92. However, the retaining member 60 may include multiple second leg portions 92. The second leg portion 92 can be used when the second leg portion 92 can be inserted into the corresponding opening in the substrate 31 and does not deformed in the displacement direction of the spring portions 75 and 85.

In the above-described embodiments, the end portion of the inserting portion 93 of the second leg portion 92 is farther from the base portion 61 than the end portions of the latch portions 73 and 83. In case that the terminal 51 has only the surface mounting portion, the second leg portion 92 can be used when the end portion of the second leg portion 92 is lower than the surface mounting portion and at least a part of the second leg portion 92 is inserted into the opening 40. In case that the terminal 51 has the through-hole mounting portion, the second leg portion 92 can be used when at least a part of the second leg portion 92 is inserted into the opening 40. For example, the end portion of the through-hole mounting portion may be lower than the end portion of the inserting portion 93.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A retaining member for retaining an electric component on a main face of a substrate, the retaining member comprising:
    a base portion configured to be fixed to the electric component; and
    a leg portion extending from the base portion, the leg portion including a latch portion, a coupling portion and a spring portion,
    wherein the base portion and the leg portion are made of one metal plate and integrated to each other,
    wherein the latch portion is coupled with one end of the coupling portion and the other end of the coupling portion is coupled with one end of the spring portion,
    wherein the latch portion and the coupling portion are configured to be inserted into an opening of the substrate so that the electric component is retained on the main face of the substrate,
    wherein a part of the latch portion is disposed at a periphery of the opening on a rear face of the substrate, a part of the coupling portion is disposed in the opening, and the spring portion is disposed on the main face of the substrate when the electric component is retained on the main face of the substrate, and
    wherein the spring portion is deformable in an extending direction of the leg portion so that the coupling portion is twisted with respect to the opening of the substrate and the latch portion is inserted into the opening.

2. The retaining member according to claim 1,
    wherein a width of the spring portion in a latitudinal direction is larger than a thickness of the metal plate,
    wherein the latitudinal direction of the spring portion is substantially perpendicular to the base portion having a plate shape.

3. The retaining member according to claim 1,
    wherein the latch portion is made of a punching metal plate.

4. The retaining member according to claim 1,
    wherein the spring portion includes a base part, a folding part, and a flection part,
    wherein the spring portion has a substantially U-shape, the base part is coupled with the folding part via the flection part, and the base part faces the folding part.

5. The retaining member according to claim 1,
    wherein the spring portion has a flat plate shape.

6. The retaining member according to claim 1,
    wherein an edge portion of the latch portion has one of a polygonal shape and a rounded shape, and
    wherein the polygonal shape has a plurality of corners, each of which has an inner angle more than 90 degrees.

7. The retaining member according to claim 1,
    wherein the latch portion protrudes from the coupling portion in a protruding direction substantially perpendicular to the extending direction of the leg portion and a latitudinal direction of the spring portion,
    wherein the latitudinal direction is perpendicular to the base portion having a plate shape, and
    wherein the latch portion has a wedge shape so that an edge portion of the latch portion is tapered.

8. The retaining member according to claim 1,
    wherein the leg portion includes a pair of leg elements,
    wherein the pair of leg elements extends from the base portion in a same direction and facing each other,
    wherein the latch portion includes a pair of latch elements, each of which corresponds to the leg element, and
    wherein the latch elements of the pair of leg elements protrude from the coupling portions in opposite directions to each other.

9. The retaining member according to claim 8, further comprising:
    an inclination limiter extending from the base portion in the extending direction of the pair of leg elements,
    wherein the inclination limiter is sandwiched between the pair of coupling portions and end portions of the coupling portions face each other,
    wherein one end of the inclination limiter reaches at least a portion of the pair of leg elements, which is in a middle of the pair of leg elements, and
    wherein the inclination limiter is separated from the coupling portions.

10. The retaining member according to claim 1, wherein
    the leg portion further includes a bonding portion that connects the base portion and the spring portion,
    the bonding portion is connected to one end portion of the spring portion, and the other one end portion of the spring portion is connected to the coupling portion,
    an angle between the bonding portion and the spring portion is substantially 90 degrees, and
    an angle between the spring portion and the coupling portion is substantially 90 degrees.

11. The retaining member according to claim 10, wherein
    the spring portion includes a base part, a folding part, and a flection part,
    the base part is coupled with the folding part via the flection part, and the base part faces the folding part, and the base part is substantially parallel to the folding part.

12. An electric component comprising:
a main body;
a substrate; and
a first retaining member for retaining the main body on a main face of the substrate having an opening,
wherein the first retaining member includes:
a base portion configured to be fixed to the main body; and
a leg portion extending from the base portion, the leg portion including a latch portion, a coupling portion and a spring portion,
wherein the base portion and the leg portion are made of one metal plate and integrated to each other,
wherein the latch portion is coupled with one end of the coupling portion and the other end of the coupling portion is coupled with one end of the spring portion,
wherein the latch portion and the coupling portion are configured to be inserted into the opening of the substrate so that the main body is retained on the main face of the substrate,
wherein a part of the latch portion is disposed at a periphery of the opening on a rear face of the substrate, a part of the coupling portion is disposed in the opening, and the spring portion is disposed on the main face of the substrate when the main body is retained on the main face of the substrate, and
wherein the spring portion is deformable in an extending direction of the leg portion so that the coupling portion is twisted with respect to the opening of the substrate and the latch portion is inserted into the opening.

13. The electric component according to claim 12, further comprising:
a second retaining member including a leg portion, wherein
the leg portion of the second retaining member includes a pair of leg elements,
each of the leg element has a latch element, and
one latch element and the other latch element protrude in opposite directions to each other.

14. An electric device comprising:
a substrate having an opening;
an electric component having a main body; and
a retaining member for retaining the main body on a main face of the substrate,
wherein the retaining member includes:
a base portion configured to be fixed to the main body; and
a leg portion extending from the base portion, the leg portion including a latch portion, a coupling portion and a spring portion,
wherein the base portion and the leg portion are made of one metal plate and integrated to each other,
wherein the latch portion is coupled with one end of the coupling portion and the other end of the coupling portion is coupled with one end of the spring portion,
wherein the latch portion and the coupling portion are configured to be inserted into the opening of the substrate so that the main body is retained on the main face of the substrate,
wherein a part of the latch portion is disposed at a periphery of the opening on a rear face of the substrate, a part of the coupling portion is disposed in the opening, and the spring portion is disposed on the main face of the substrate when the main body is retained on the main face of the substrate, and
wherein the spring portion is deformable in an extending direction of the leg portion so that the coupling portion is twisted with respect to the opening of the substrate and the latch portion is inserted into the opening.

15. The electric device according to claim 14,
wherein the leg portion includes a pair of leg elements,
wherein the pair of leg elements extends from the base portion in a same direction and facing each other,
wherein the latch portion includes a pair of latch elements, each of which corresponds to the leg element, and
wherein the latch elements of the pair of leg elements protrude from the coupling portions in opposite directions to each other.

16. The electric device according to claim 15,
wherein the opening of the substrate has a hole shape extended in an extending direction,
wherein the latch portions of the pair of leg elements protrude from the coupling portions in opposite directions to each other along a longitudinal direction of the opening perpendicular to the extending direction, and
wherein the latch portions are disposed on the rear face of the substrate at the periphery of the opening along the longitudinal direction.

17. The electric device according to claim 15,
wherein a width between the pair of coupling portions is larger than a width of the opening before inserting the latch portions into the opening.

18. The electric device according to claim 15,
wherein a width between the pair of coupling portions at the rear face of the substrate is smaller than the width between the pair of coupling portions at the main face of the substrate when the main body is retained on the main face of the substrate.

19. A retaining member for retaining an electric component on a main face of a substrate, the retaining member comprising:
a base portion configured to be fixed to the electric component; and
a first leg portion extending from the base portion in a first direction, the first leg portion including a latch portion, a coupling portion and a spring portion,
wherein the base portion and the first leg portion are made of one metal plate and integrated to each other,
wherein the latch portion is coupled with one end of the coupling portion, the other end of the coupling portion is coupled with one end of the spring portion, and the other end of the spring portion is coupled with the base portion,
wherein the latch portion and the coupling portion are configured to be inserted into a first opening of the substrate so that the electric component is retained on the main face of the substrate,
wherein a part of the latch portion is disposed at a periphery of the first opening on a rear face of the substrate, a part of the coupling portion is disposed in the first opening and the spring portion is disposed on the main face of the substrate when the electric component is retained on the main face of the substrate,
wherein the spring portion is deformable so that the coupling portion is twisted with respect to the first opening of the substrate and the latch portion is inserted into the first opening,
wherein the spring portion and the coupling portion extend in the first direction,
wherein a width of the spring portion in a second direction, which is substantially perpendicular to the base portion having a plate shape, is larger than the thickness of the metal plate, wherein a portion between a coupling end of the spring portion with the coupling portion and a coupling end of the spring portion with the base portion is a flat plate, and wherein the latch portion protrudes from the coupling portion in a third direction, which is perpendicular to the first and second direction, and a thickness direction of the flat plate of the spring portion is substantially parallel to the third direction of the latch portion.

20. The retaining member according to claim 19, wherein a width of the coupling portion in the third direction, which is substantially perpendicular to a longitudinal direction of the coupling portion and the thickness direction of the coupling portion, is larger than the thickness of the metal plate, wherein a flat plate part of the coupling portion other than a coupling end with the spring portion is integrated with the latch portion, and a thickness direction of the flat plate part of the coupling portion is substantially parallel to a thickness direction of the base portion, the thickness direction of the base portion being substantially perpendicular to both the first and third directions, wherein the spring portion is bent substantially same degrees in a same direction with respect to the base portion and the coupling portion, and wherein the thickness direction of the flat plate of the spring portion is substantially perpendicular to the thickness direction of the base portion.

21. The retaining member according to claim 19, wherein the width of the spring portion in the third direction becomes wider toward the coupling end of the spring portion with the base portion.

22. The retaining member according to claim 19, wherein the coupling end of the spring portion with the base portion has one of a polygonal shape, which is obtained by combining multiple angles more than 90 degrees, and a rounded shape.

23. The retaining member according to claim 19, wherein the flat plate portion of the spring portion has a substantially U-shape.

24. The retaining member according to claim 19, wherein the flat plate portion of the spring portion includes a pair of folding portions and end surfaces of the pair of folding portions are adjacent each other.

25. The retaining member according to claim 19, wherein the first leg portion includes a pair of first leg elements, wherein the pair of first leg elements extends from the base portion in a same direction.

26. The retaining member according to claim 25, wherein each first leg element includes the latch portion, the coupling portion and the spring portion, wherein a width of each coupling portion in the third direction, which is substantially perpendicular to a longitudinal direction of the coupling portion and the thickness direction of the coupling portion, is larger than the thickness of the metal plate, wherein each flat plate part of the coupling portions other than a corresponding coupling end with the spring portion is integrated with a corresponding latch portion and a thickness direction of each flat plate part of the coupling portions is substantially parallel to a thickness direction of the base portion, the thickness direction of the base portion being substantially perpendicular to both the first and third directions, wherein each of the spring portions is bent substantially same degrees in a same direction with respect to the base portion and a corresponding coupling portion, and wherein the thickness direction of each of flat plates of the spring portions is substantially perpendicular to the thickness direction of the base portion.

27. The retaining member according to claim 26, wherein each of the latch portions is disposed on a same plane of the base portion before the latch portions are inserted into the first opening.

28. The retaining member according to claim 26, wherein the latch portions deviate from a plane of the base portion by the thickness of the base portion or more before the latch portions are inserted into the first opening.

29. The retaining member according to claim 26, further comprising:

a second leg portion extending from the base portion in the first direction of the first leg elements, the second leg portion being between the pair of first leg elements, wherein the second leg portion and the pair of first leg portions are integrated to each other, wherein the second leg portion has a flat plate portion and an end portion of the flat plate portion is configured to be inserted into a second opening of the substrate, wherein a width of the second leg portion in the third direction, which is substantially perpendicular to a longitudinal direction of the second leg portion and a thickness direction of the second leg portion, is larger than the thickness of the metal plate, and wherein a thickness direction of the flat plate portion of the second leg portion is substantially parallel to the thickness direction of the base portion.

30. The retaining member according to claim 29, wherein the end portion of the flat plate portion of the second leg portion is disposed farther from the base portion than end portions of the latch portions in the first leg elements.

31. The retaining member according to claim 29, wherein the flat plate portion of the second leg portion includes an inserting portion and a retaining portion, wherein the inserting portion is configured to be inserted into the second opening and the retaining portion connects the inserting portion and the base portion, and wherein a width of the retaining portion in the third direction is larger than a width of the inserting portion in the third direction.

32. An electric component comprising:

a plurality of conductive terminals electrically coupled with lands on a substrate;

a main body in which the plurality of terminals are disposed; and a retaining member for retaining the main body on a main face of the substrate having an opening, wherein the retaining member includes:

a base portion configured to be fixed to the electric component; and a first leg portion extending from the base portion in a first direction, the first leg portion including a latch portion, a coupling portion and a spring portion, wherein the base portion and the first leg portion are made of one metal plate and integrated to each other, wherein the latch portion is coupled with one end of the coupling portion, the other end of the coupling portion is coupled with one end of the spring portion, and the other end of the spring portion is coupled with the base portion, wherein the latch portion and the coupling portion are configured to be inserted into the opening of the substrate so that the electric component is retained on the main face of the substrate, wherein a part of the latch portion is disposed at a periphery of the opening on a rear face of the substrate, a part of the coupling portion is disposed in the opening and the spring portion is disposed on the main face of the substrate when the electric component is retained on the main face of the substrate, wherein the spring portion is deformable so that the coupling portion is twisted with respect to the opening of the substrate and the latch portion is inserted into the opening, wherein the spring portion and the coupling portion extend in the first direction, wherein a width of the spring portion in a second direction, which is substantially perpendicular to the base portion having a plate shape, is larger than the thickness of the metal plate, wherein a portion between a coupling end of the spring portion with the coupling portion and a coupling end of the spring portion with the base portion is a flat plate, and wherein the latch portion protrudes from the coupling portion in a third direction, which is perpendicular to the first and second direction, and a thickness direction of the flat plate of the spring portion is substantially parallel to the third direction of the latch portion.

33. The electric component according to claim 32, wherein a width of the coupling portion in the third direction, which is substantially perpendicular to a longitudinal direction of the coupling portion and the thickness direction of the coupling portion, is larger than the thickness of the metal plate, wherein a flat plate part of the coupling portion other than a coupling end with the spring portion is integrated with the latch portion, and a thickness direction of the flat plate part of the coupling portion is substantially parallel to a thickness direction of the base portion, the thickness direction of the base portion being substantially perpendicular to both the first and third directions, wherein the spring portion is bent substantially same degrees in a same direction with respect to the base portion and the coupling portion, and wherein the thickness direction of the flat plate of the spring portion is substantially perpendicular to the thickness direction of the base portion.

34. The electric component according to claim 33, wherein the retaining member is disposed at least one of end portions of the main body in the second direction so that the thickness direction of the base portion is substantially parallel to the second direction of the main body, and wherein the spring portion is bent with respect to the base portion so that the spring portion is toward an outside of the main body in the second direction.

35. The electric component according to claim 32, wherein the plurality of terminals includes a surface mounting terminal having a surface mounting portion, which is surface-mounted to the lands on the substrate, and wherein the surface mounting terminal is arranged at an end portion of the substrate extending outwardly from the main body.

36. The electric component according to claim 35, comprising:

wherein the first leg portion includes a pair of first leg elements, wherein the main body along the main face of the substrate is elongated in the second direction, wherein the surface mounting portion has a plurality of steps in a direction substantially perpendicular to the second direction of the main body, and wherein the surface mounting portion further has a plurality of steps between the latch portions of the pair of first leg elements in the direction substantially perpendicular to the second direction of the main body.

37. The electric component according to claim 35, wherein the coupling portion has a substantially L-shape so that an arm portion of the coupling portion extending from a coupling end of the coupling portion with the spring portion in the third direction, is arranged at the periphery of the opening on the main face of the substrate, wherein the arm portion is in contact with the main face of the substrate, and wherein a bottom surface of the surface mounting portion is arranged nearer to the latch portion than the arm portion in a thickness direction of the substrate.

38. An electric device comprising:

a substrate having a plurality of lands and a first opening; and an electric component having a plurality of conductive terminals electrically coupled with the plurality of lands, a main body in which the plurality of terminals are disposed, and a retaining member for retaining the main body on a main face of the substrate, the electric component being mounted on the substrate, wherein the retaining member includes:

a base portion configured to be fixed to the electric component; and a first leg portion extending from the base portion in a first direction, the first leg portion including a latch portion, a coupling portion and a spring portion, wherein the base portion and the first leg portion are made of one metal plate and integrated to each other, wherein the latch portion is coupled with one end of the coupling portion, the other end of the coupling portion is coupled with one end of the spring portion and the other end of the spring portion is coupled with the base portion, wherein the latch portion and the coupling portion are configured to be inserted into the first opening of the substrate so that the electric component is retained on the main face of the substrate, wherein a part of the latch portion is disposed at a periphery of the first opening on a rear face of the substrate, a part of the coupling portion is disposed in the first opening and the spring portion is disposed on the main face of the substrate when the electric component is retained on the main face of the substrate, wherein the spring portion is deformable so that the coupling portion is twisted with respect to the first opening of the substrate and the latch portion is inserted into the first opening, wherein the spring portion and the coupling portion extend in the first direction, wherein a width of the spring portion in a second direction, which is substantially perpendicular to the base portion having a plate shape, is larger than the thickness of the metal plate, wherein a portion between a coupling end of the spring portion with the coupling portion and a coupling end of the spring portion with the base portion is a flat plate, and wherein the latch portion protrudes from the coupling portion in a third direction, which is perpendicular to the first and second direction, and a thickness direction of the flat plate of the spring portion is substantially parallel to the third direction of the latch portion.

39. The electric device according to claim 38, wherein a width of the coupling portion in the third direction, which is substantially perpendicular to a longitudinal direction of the coupling portion and the thickness direction of the coupling portion, is larger than the thickness of the metal plate, wherein a flat plate part of the coupling portion other than a coupling end with the spring portion is integrated with the latch portion, and a thickness direction of the flat plate part of the coupling portion is substantially parallel to a thickness direction of the base portion, the thickness direction of the base portion being substantially perpendicular to both the first and third directions, wherein the spring portion is bent substantially same degrees in a same direction with respect to the base portion and the coupling portion, and wherein the thickness direction of the flat plate of the spring portion is substantially perpendicular to the thickness direction of the base portion.

40. The electric device according to claim 36, further comprising:

a dummy land made of metal at the periphery of the first opening on at least the main face, on which the electric component is mounted, wherein the dummy land does not provide an electrical connecting function, wherein the coupling portion has a substantially L-shape so that an arm portion of the coupling portion extending from a coupling end of the coupling portion with the spring portion in the third direction, is arranged at the periphery of the opening on the main face of the substrate, and wherein the arm portion is disposed over the dummy land and coupled with the dummy land through a solder.

41. The electric device according to claim 38, wherein the first leg portion includes a pair of first leg elements, wherein the pair of first leg elements extends from the base portion in a same direction.

42. The electric device according to claim 41, wherein the substrate further includes a second opening arranged separately from the first opening, and wherein the pair of first leg elements is configured to be respectively inserted into the first opening and the second opening.

43. The electric device according to claim 41, wherein the first opening along the main face of the substrate has a hole shape extended in one direction, wherein the latch portions of the pair of first leg elements protrude from the coupling portions in opposite directions to each other along a longitudinal direction of the opening, and wherein the latch portions are disposed on the rear face of the substrate at the periphery of the opening along the longitudinal direction.

44. The electric device according to claim 41, further comprising:

a second leg portion extending from the base portion in the first direction of the first leg elements, the second leg portion being between the pair of first leg elements, and a dummy land made of metal at the periphery of the first opening on at least the main face, on which the electric component is mounted, wherein the second leg portion is configured to be inserted into a third opening of the substrate, wherein the dummy land does not provide an electrical connecting function, wherein the second leg portion and the pair of first leg elements are integrated to each other, wherein the second leg portion has a flat plate portion, wherein a width of the second leg portion in the third direction, which is substantially perpendicular to a longitudinal direction of the second leg portion and a thickness direction of the second leg portion, is larger than the thickness of the metal plate, wherein the flat plate portion of the second leg portion includes an inserting portion and a retaining portion, wherein the inserting portion is configured to be inserted into the third opening and the retaining portion connects the inserting portion and the base portion, wherein a thickness direction of the flat plate portion of the second leg portion is substantially parallel to the thickness direction of the base portion, and wherein an end surface of the inserting portion is disposed over the dummy land and coupled with the dummy land through solder.

45. A retaining member for retaining an electric component on a main face of a substrate, the retaining member comprising:

a base portion configured to be fixed to the electric component; and a leg portion extending from the base portion, the leg portion including a latch portion, a coupling portion and a spring portion, wherein the base portion and the leg portion are made of one metal plate and integrated to each other, wherein the latch portion is coupled with one end of the coupling portion and the other end of the coupling portion is coupled with one end of the spring portion, wherein the latch portion and the coupling portion are configured to be inserted into an opening of the substrate so that the electric component is retained on the main face of the substrate, wherein a part of the latch portion is disposed at a periphery of the opening on a rear face of the substrate, a part of the coupling portion is disposed in the opening, and the spring portion is disposed on the main face of the substrate when the electric component is retained on the main face of the substrate, wherein the spring portion is deformable so that the coupling portion is twisted with respect to the opening of the substrate and the latch portion is inserted into the opening, wherein the spring portion includes a base part, a folding part, and a flection part, and wherein the spring portion has a substantially U-shape, the base part is coupled with the folding part via the flection part, and the base part faces the folding part.

* * * * *